(12) United States Patent
Vivek et al.

(10) Patent No.: US 12,706,553 B2
(45) Date of Patent: Aug. 11, 2026

(54) ENERGY HARVESTING MODULE AND METHOD OF MAKING AN ENERGY HARVESTING MODULE

(71) Applicant: TDK Corporation, Tokyo (JP)

(72) Inventors: Vibhu Vivek, Santa Clara, CA (US); Ishita Jain, Milpitas, CA (US); John Sze, Saratoga, CA (US); Ryan Griswold, San Martin, CA (US); Keisuke Ishida, San Jose, CA (US)

(73) Assignee: TDK Corporation, Tokyo (JP)

( * ) Notice: Subject to any disclaimer, the term of this patent is extended or adjusted under 35 U.S.C. 154(b) by 1024 days.

(21) Appl. No.: 17/894,056

(22) Filed: Aug. 23, 2022

(65) Prior Publication Data

US 2024/0072687 A1 Feb. 29, 2024

(51) Int. Cl.

| | |
|---|---|
| ***H02N 2/18*** | (2006.01) |
| ***H01L 41/113*** | (2006.01) |
| ***H02J 7/32*** | (2006.01) |
| ***H02J 50/00*** | (2016.01) |
| ***H10N 30/067*** | (2023.01) |
| ***H10N 30/30*** | (2023.01) |
| ***H10N 30/857*** | (2023.01) |
| *B60C 23/04* | (2006.01) |

(52) U.S. Cl.

CPC ................ *H02N 2/18* (2013.01); *H02J 7/32* (2013.01); *H02J 50/001* (2020.01); *H10N 30/067* (2023.02); *H10N 30/30* (2023.02); *H10N 30/857* (2023.02); *B60C 23/0411* (2013.01)

(58) Field of Classification Search

CPC .... H10N 30/30; H10N 30/302; H10N 30/304; H10N 30/306; H10N 30/308

USPC ........................................................ 310/339

See application file for complete search history.

(56) References Cited

U.S. PATENT DOCUMENTS

| | | | | |
|---|---|---|---|---|
| 2012/0055257 A1* | 3/2012 | Shaw-Klein | ......... | H10N 30/302 29/25.35 |
| 2013/0002095 A1* | 1/2013 | Van Der Linden | .. | H10N 30/883 310/340 |
| 2021/0028725 A1 | 1/2021 | Griswold | | |

* cited by examiner

*Primary Examiner* — Derek J Rosenau

(74) *Attorney, Agent, or Firm* — Morgan, Lewis & Bockius LLP

(57) ABSTRACT

Energy harvesting module and, more particularly, energy harvesting module configured to be coupled to a rotatable component of a vehicle's wheel, and methods of making an energy harvesting module are disclosed. In some embodiments, an energy harvesting system includes: a piezoelectric component configured to produce energy in response to mechanical strain imparted on the piezoelectric component, wherein the piezoelectric component is configured to deform while experiencing the mechanical strain, and the piezoelectric component comprises a piezoelectric material layer, one or more conductive bonding layers, a load backing layer, and one or more electrode layers, wherein the load backing layer comprises a fiber reinforced composite material.

14 Claims, 28 Drawing Sheets

ENERGY HARVESTING MODULE AND METHOD OF MAKING AN ENERGY HARVESTING MODULE

TECHNICAL FIELD

This application relates generally to an energy harvesting module and, more particularly, relates to an energy harvesting module configured to be coupled to a rotatable component of a vehicle's wheel.

BACKGROUND

In the area of automotive sensor systems, the demand for advanced sensing applications to complement existing electronic safety systems has drawn considerable attention. This includes, for example, measurements of temperature, pressure, acceleration, and forces (static and dynamic) acting on a tire, wheel and car. All these sensors create an increased power demand to operate and transmit data more frequently. Current power sources (e.g., lithium ion batteries) driving these sensors are limited in their capacity and exhibit drawbacks such as low durability, difficulty of replacement, and most notably, inferior sustainability in terms of environmental impact. With increased power load, these power sources are further subjected to accelerated discharge cycles, resulting in frequent or premature replacement of entire sensor modules. This may increase the overall cost of ownership and maintenance to a user.

The foregoing examples of the related art and limitations related therewith are intended to be illustrative and not exclusive. Other limitations of the related art will become apparent upon a reading of the specification and a study of the drawings.

SUMMARY

The exemplary embodiments disclosed herein are directed to solving the issues relating to one or more of the problems presented in the prior art, as well as providing additional features that will become readily apparent by reference to the following detailed description when taken in conjunction with the accompanied drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the invention.

In certain embodiments, an energy harvesting module includes: a piezoelectric component configured to produce energy in response to mechanical strain imparted on the piezoelectric component, wherein the piezoelectric component is configured to deform while experiencing the mechanical strain, and the piezoelectric component comprises a piezoelectric material layer, one or more conductive bonding layers, a load backing layer, and one or more electrode layers, wherein the load backing layer comprises a fiber reinforced composite material.

In certain embodiments, the one or more electrode layers include a first electrode layer, the one or more conductive bonding layers comprise a first conductive bonding layer, wherein the first conductive bonding layer is vertically above and in direct contact with the load backing layer, and the piezoelectric material layer is vertically above and in direct contact with the first conductive bonding layer while the piezoelectric material layer is horizontally surrounded by the first electrode layer.

In certain embodiments, the fiber reinforced composite material comprises at least one of: a carbon fiber composite material, a glass fiber composite material, a carbon nanotube reinforced composite material, a graphene reinforced composite, and a ceramic matrix composite material. In some examples, the fiber reinforced composite material is in direct contact with the first conductive bonding layer by removing a surface layer of the fiber reinforced composite material, wherein removing the surface layer comprises a mechanical etching, ablation, chemical etching, polishing, or a laser etching process.

In certain embodiments, the fiber reinforced composite material comprises an elastic modulus, wherein the elastic modulus after the surface layer is removed is higher than the elastic modulus before the surface layer is removed.

In certain embodiments, the one or more electrode layers comprise a second electrode layer, the one or more conductive bonding layers comprise a second conductive bonding layer, wherein the second conductive bonding layer is vertically above and in direct contact with the piezoelectric material layer, and the second electrode layer is vertically above and in direct contact with the second conductive bonding layer. In some examples, the one or more conductive bonding layers comprise metal powders and resin.

In certain embodiments, an energy harvesting module includes a piezoelectric component configured to produce energy in response to mechanical strain imparted on the piezoelectric component, wherein the piezoelectric component is configured to deform while experiencing the mechanical strain, and the piezoelectric component comprises a piezoelectric material layer, one or more conductive bonding layers, a load backing layer, one or more electrode layers, and one or more metal layers, wherein the load backing layer comprises a fiber reinforced composite material.

In certain embodiments, the one or more metal layers comprise a first metal layer, the one or more electrode layers comprise a first electrode layer, and the one or more conductive bonding layers comprise a first conductive bonding layer, wherein the first conductive bonding layer is vertically above and in direct contact with the load backing layer, the first metal layer is vertically above and in direct contact with the first conductive bonding layer, wherein the first metal layer is electrically connected with the first conductive bonding layer, and the piezoelectric material layer is vertically above the first metal layer while the piezoelectric material layer is horizontally surrounded by the first electrode layer.

In certain embodiments, the piezoelectric component further includes one or more interface layers, wherein the one or more interface layers comprise a first interface layer, wherein the first interface layer is vertically above and in direct contact with the first metal layer, and the piezoelectric material layer is vertically above and in direct contact with the first interface layer.

In certain embodiments, the one or more metal layers include a second metal layer, the one or more electrode layers include a second electrode layer, and the one or more conductive bonding layers include a second conductive bonding layer, wherein the second metal layer is vertically above the piezoelectric material layer.

In certain embodiments, the second conductive bonding layer is vertically above and in direct contact with the second metal layer, wherein the second conductive bonding layer is electrically connected with the second metal layer.

In certain embodiments, the one or more interface layers comprise voids.

In certain embodiments, a method includes: forming a load backing layer comprising a fiber reinforced composite material, forming a conductive bonding layer, forming a piezoelectric material layer comprising a piezoelectric body, forming an electrode layer, sintering the piezoelectric body in the piezoelectric material layer, applying a compound paste on the piezoelectric body to form an interface layer, drying the piezoelectric body, applying a metal paste on the compound paste to form a metal layer, and sintering the metal layer and the compound paste, removing a surface layer of the fiber reinforced composite material by a mechanical etching process, ablation, chemical etching, or a laser etching process, stacking the conductive bonding layer on the load backing layer, stacking the piezoelectric body with the metal layer on the conductive bonding layer, and stacking the electrode layer on the conductive bonding layer surrounding piezoelectric material layer. In certain embodiments, the surface layer comprises a resin layer.

BRIEF DESCRIPTION OF THE DRAWINGS

Various exemplary embodiments of the invention are described in detail below with reference to the following Figures. The drawings are provided for purposes of illustration only and merely depict exemplary embodiments of the invention. These drawings are provided to facilitate the reader's understanding of the invention and should not be considered limiting of the breadth, scope, or applicability of the invention. It should be noted that for clarity and ease of illustration these drawings are not necessarily drawn to scale.

DETAILED DESCRIPTION OF EXEMPLARY EMBODIMENTS

Figure 1:
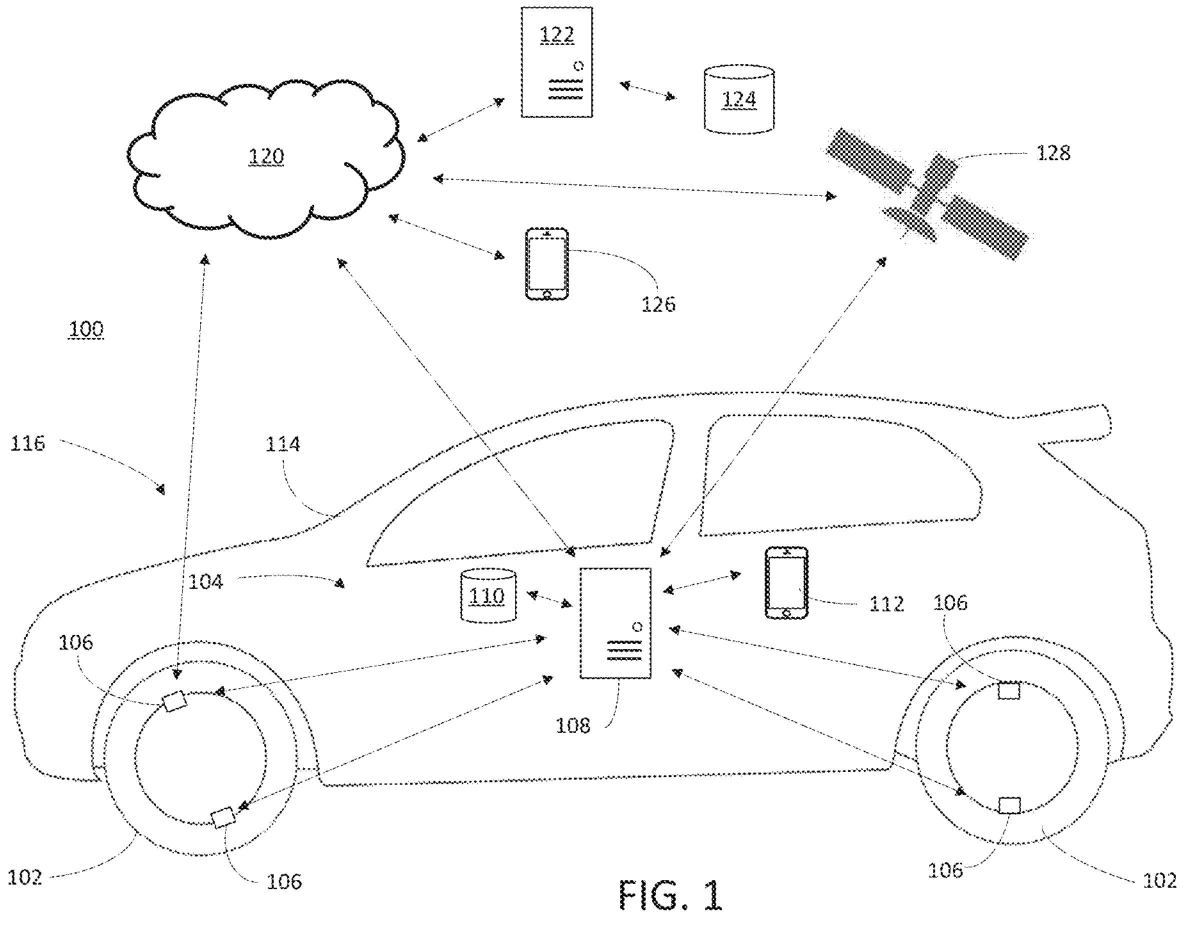
FIG. 1 is a diagram of a smart wheel sensor system that integrates at least one smart wheel, in accordance with various embodiments.

Various exemplary embodiments of the invention are described below with reference to the accompanying figures to enable a person of ordinary skill in the art to make and use the invention. As would be apparent to those of ordinary skill in the art, after reading the present disclosure, various changes or modifications to the examples described herein can be made without departing from the scope of the invention. Thus, the present invention is not limited to the exemplary embodiments and applications described and illustrated herein. Additionally, the specific order or hierarchy of steps in the methods disclosed herein are merely exemplary approaches. Based upon design preferences, the specific order or hierarchy of steps of the disclosed methods or processes can be rearranged while remaining within the scope of the present invention. Thus, those of ordinary skill in the art will understand that the methods and techniques disclosed herein present various steps or acts in a sample order, and the invention is not limited to the specific order or hierarchy presented unless expressly stated otherwise.

As noted above, batteries or other disposable energy sources powering vehicular sensor systems are limited in their capacity and exhibit drawbacks such as low durability, difficulty of replacement, and inferior environmental sustainability. An alternative to disposable batteries in vehicular sensor systems involves harvesting energy from the environment. Accordingly, new systems and methods utilizing energy harvesters for harvesting energy from an environment proximate to a wheel are disclosed herein, in accordance with various embodiments. These energy harvesters may be devices that transform energy from various sources such as kinetic energy, heat, light, and/or mechanical energy into usable electrical energy, in accordance with various embodiments. For example, an energy harvester may utilize piezoelectric transduction to transform tire deformations into electrical energy. This amount of energy transformation may vary based on a rotating speed of a wheel (e.g., a speed of the car as determined by a driver). Also, in certain embodiments, energy harvesters may be placed on a rim of a wheel for more effective energy capture.

In various embodiments, an energy harvester may produce sustained outputs at varying vehicle speeds based on the weight of the vehicle acting on an underlying surface (e.g., a road) through a rim and tire. For example, vehicles may have wheels (e.g., wheels with pneumatic tires). A wheel, with an inflated tire and rigid rim, can exchange vehicular actions along a bead area of the tire that interfaces with the rigid rim. These vehicular actions may include traction, braking, steering, load support, and the like. As the wheel rotates, the lower part of the tire may apply forces in the bead area to counter the weight of the car. These forces may cause sidewalls of the wheel to bend due to the internal air pressure of the tire (e.g., due to the intimate contact between a rubber tire and metal rim).

In various embodiments, an energy harvester may include a substrate and a piezoelectric component. The substrate may be placed behind (e.g., proximate to) the piezoelectric component to form a cavity that allows the force of the vehicle during motion (e.g., wheel rotation) to displace (e.g., strain or bend) the piezoelectric component and generate a charge (e.g., electrical energy). The energy harvester, as a piezo-substrate assembly, can then be arrayed around the circumference of the rim, generating continuous power as the wheel rotates. In certain embodiments when the energy harvester is mounted on the rim of the wheel, the energy harvester may be separate from the rim and/or the tire. Thus, the energy harvester need not be replaced or changed when the tire is replaced. The energy harvester may also be coupled with an energy storage device (e.g., a rechargeable battery) to provide recharge cycles that can supply power to an array of sensors placed in, on, or proximate to the wheel.

In some embodiments, a piezoelectric component may utilize strain (e.g., mechanical strain indicative of relative motion/deflection) to generate charge. Furthermore, the substrate may be structured to facilitate the expression of the strain (e.g., relative motion/deflection) of the piezoelectric component when placed between the tire and rim of a wheel.

In various embodiments, the substrate may include a geometry and be located in a power dense area of a wheel to increase strain (e.g., energy generation) from a piezoelectric component mounted on the substrate. Stated another way, an energy harvester may be a mechanism with a specific internal and external geometry sitting between a wheel and tire that transforms mechanical force (vehicle weight) and locomotion into usable strain generated on a piezoelectric component.

In certain embodiments, an energy harvester may harvest energy from mechanical loads exerted upon a wheel. For example, the load of the vehicle and the force exerted by the vehicle in the presence of a mechanical substrate may induce a strain on a piezoelectric component that produces substantial power which can be harnessed to power electronic or sensing systems in the vehicle and/or wheel.

This energy harvester, inclusive of the piezoelectric component and substrate in certain embodiments, may be modular and scaled to various wheel diameters, energy requirements, and sensor locations. In further embodiments, this substrate may encase and protect a piezoelectric component mounted on the substrate and other electronics from degradation due to exposure. In yet further embodiments, the energy harvester may include the piezoelectric component and a region of a wheel (e.g., a staging surface) configured or constructed to induce strain upon the piezoelectric component.

In various embodiments, the substrate may include a three-dimensional curved bottom surface that interfaces with a rim (e.g., a rotatable component of a wheel separate from a tire (e.g., a flexible component) of a wheel). This three-dimensional curved bottom surface may include a compound curve in three dimensions (e.g., length, height, and width). Each of the length, height, and width may define dimensions or axes orthogonal to each other in three dimensional physical space. For example, the length may be along an axis orthogonal to the height, which may be along an axis orthogonal to the width, which may be along an axis orthogonal to the length. In certain embodiments, the length, height, and width may be referred to as an x-axis, a z-axis, and a y-axis. Also, the substrate may include a two-dimensional (e.g., two of a length, a height and a width) curved staging surface (e.g., a micro cavity or depression) opposite a bottom surface of the substrate. In certain embodiments, this two dimensional curved staging surface may be curved in a convex or concave manner and the piezoelectric component may incur strain to deform and conform to the two dimensional curved staging surface. Accordingly, the rectangular piezoelectric component may be configured to bend and conform to the two dimensional curved staging surface while sitting on the rim via the three-dimensional curved bottom surface (e.g., by being secured on the substrate with the three-dimensional curved bottom surface).

In certain embodiments, the piezoelectric component may be formed with multiple layers. For example, the piezoelectric component may include a load backing layer. This load backing layer may comprise, for example, a fiber reinforced composite material with sufficient load flexibility to keep the piezoelectric component together. The piezoelectric component may further include a central piezoelectric material layer that may be configured to generate electrical charge when it is mechanically deformed. The piezoelectric component may further include an electrode layer that may be formed as a mesh with the central piezoelectric material layer to more effectively harvest electrical charge from the central piezoelectric material layer. In particular embodiments, an electrode layer may include an electrode embedded within (e.g., held in place by) a flexible material (e.g., epoxy) and in direct or indirect contact with the piezoelectric material layer.

In certain embodiments, an electrode layer may include a flexible interconnect with an electrode. Also, the electrode layer may contain a flexible material that keeps the electrode and flexible interconnect in place. This flexible interconnect may be configured to electrically connect the electrode in the electrode layer to other electrical components (e.g., a pressure sensor) coupled to the wheel in order to provide power to the other electrical components or for the other electrical components to perform measurements based on signals received from the flexible interconnect.

In certain embodiments, the piezoelectric component comprises two electrode layers, a piezoelectric material layer, two conductive bonding layers, a load backing layer, and an electrical wire connected to a first electrode layer of the two electrode layers. A second electrode layer of the two electrode layers may be used to indirectly contact the piezoelectric material layer to harvest electrical charge from the piezoelectric material layer. In some embodiments, the two electrode layers may represent different circuits with different electric potentials, such that there is an electric potential difference between the two electrode layers. The electric potential difference between the two electrode layers may be then used to provide power to devices of a smart wheel sensor system through the electrical wire. In some embodiments, the piezoelectric material layer is surrounded by the first electrode layer with a gap between an inner peripheral edge of the first electrode layer and outer peripheral edge of the piezoelectric material layer to prevent a short circuit between the piezoelectric material layer and the first electrode layer. In some embodiments, the gap is 100 μm or more.

In various embodiments, the piezoelectric component may be adapted to incur strain (e.g., generate energy) in any type of wheel in which force (e.g., to produce strain) is applied during rotation. Examples of different types of wheels may include wheels with an air-inflated tire, wheels with an airless tire (e.g., a non-pneumatic or flat-free tire), wheels that are cylindrical, and wheels that are spherical. In additional embodiments, a piezoelectric component may be adhered directly to a wheel (e.g., without a substrate) to incur strain and deform along with portions of the wheel which may deform in response to a load. For example, a piezoelectric component may be adhered along an outer surface of a spherical tire, adhered along a spoke of an airless tire, or adhered to any other component of a wheel that may deform in response to a load.

Although certain embodiments may reference piezoelectric components with a particular number of layers in a particular order, it can be noted that piezoelectric components may include any number of layers in any order as desired for different applications in various embodiments. For example, a piezoelectric component may include four layers with a load backing layer connected to an upper electrode layer, which is connected to a piezoelectric material layer, which is connected to a lower electrode layer.

In various embodiments, an energy harvester may be part of a smart wheel sensor system to provide power for least one sensor of the smart wheel sensor system. For example, the energy harvester may be arrayed on a wheel of a vehicle (e.g., a wheel driven object) along with other sensors of the smart wheel sensor system. The smart wheel sensor system may include multiple types of sensors, which may each be configured to collect different types of smart wheel sensor system data. For example, the smart wheel sensor system may include a height sensor configured to produce barometric pressure sensor data; an acoustic sensor configured to produce acoustic sensor data; an image sensor configured to produce image sensor data; a gas sensor configured to produce gas sensor data; a magnetic sensor configured to produce magnetic sensor data; an accelerometer sensor configured to produce acceleration sensor data; a gyroscope sensor configured to produce gyroscopic sensor data; and a humidity sensor configured to produce humidity sensor data. The smart wheel sensor system data produced by the smart wheel sensor system may be centrally and locally analyzed at a vehicle that relies upon the smart wheel for movement (e.g., by a computer or server within or supported by the vehicle's body) to determine a status of the vehicle and/or an individual smart wheel. Advantageously, the smart wheel sensor system may be implemented in an autonomous vehicle, such as part of a backup sensor system to augment the autonomous vehicle's safety system. In various embodiments, an individual wheel on which devices of a smart wheel sensor system are arrayed may be referred to as a smart wheel.

FIG. 1 is a diagram of a smart wheel sensor system 100 that integrates at least one smart wheel 102, in accordance with various embodiments. The smart wheel sensor system 100 may include a local sensor system 104 (e.g., a local smart wheel sensor system) with a device platform 106 arrayed on respective smart wheels 102. The device platform 106 may represent devices on a smart wheel, such as an energy harvester and/or sensor powered by an energy harvester.

This local sensor system 104 may include a local smart wheel server 108 that communicates with the sensors within the device platform 106. Accordingly, each device platform 106 may include at least one sensor and also include ancillary interfaces, such as communication interfaces, for communication with the local smart wheel server 108. This local smart wheel server 108 may also be in communication with a local smart wheel datastore 110 and any local user devices 112, such as a smartphone. For ease of explanation, the term local may refer to devices that are bound within or on a vehicle body 114 or a smart wheel 102 of a vehicle 116.

In contrast, the term remote may refer to devices that are outside of the vehicle body 114 or smart wheel 102 of the vehicle 116. For example, the local smart wheel server 108 may be configured to communicate with a remote network 120, such as the Internet. This remote network 120 may further connect the local smart wheel server 108 with remote servers 122 in communication with remote datastores 124 or remote user devices 126. In addition, the local smart wheel server 108 may be in communication with external sensors or devices, such as a remote satellite 128 for global positioning system (GPS) information.

In various embodiments, at least some of the devices of the device platform 106 may be configured to communicate with the local smart wheel server 108 via a communications interface. This communications interface may enable devices to communicate with each other using any communication medium and protocol. Accordingly, the communications interface 280 may include any suitable hardware, software, or combination of hardware and software that is capable of coupling the device platform 106 with the local smart wheel server 108. The communications interface may be arranged to operate with any suitable technique for controlling information signals using a desired set of communications protocols, services or operating procedures. The communications interface may comprise the appropriate physical connectors to connect with a corresponding communications medium. In certain embodiments, this communications interface may be separate from a controller area network (CAN) bus. For example, the communications interface may facilitate wireless communications within the local sensor system 104 (e.g., between the device platforms 106 and the local smart wheel server 108). Further discussion of such a communications interface is provided in greater detail below.

In certain embodiments, at least some of the devices of the device platform 106 may be configured to communicate with the remote network 120. For example, sensor data produced by a sensor of the device platform 106 may be communicated to the remote servers 122, the remote datastores 124, the remote user devices 126, and/or the remote satellite 128 via the remote network 120. In various embodiments, certain devices of the device platform 106 may communicate directly with the remote network 120. For example, certain devices of the device platform 106 may include communication interfaces (discussed further below) that may be configured to communicate directly with the remote network 120 in a manner that bypasses the local server 108. In other embodiments, certain devices of the device platform 106 may communicate indirectly with the remote network 120. For example, certain devices of the device platform 106 may include communication interfaces (discussed further below) that may be configured to communicate indirectly with the remote network 120 via the local server 108, which includes one or more communication interfaces (discussed further below) to communicate with external devices via various communication protocols (e.g., LTE, 5G, etc.), as discussed in further detail below.

These communications from the device platform 106 to the remote server 122, whether direct or indirect, may include sensor data collected by the device platform for analysis by the remote server 122. This sensor data may be analyzed by the remote server 122 to determine an action that may be performed by the local server 108, in accordance with various embodiments. For example, as will be discussed in further detail below, this sensor data may be utilized to determine a parameter value. Then certain actions may be performed based on the state of the parameter value, such as in response to the parameter value meeting certain threshold values (e.g., an alert or notification presented via a user interface). This determination of a parameter value may be performed at the remote server 122 and then the parameter values communicated to the local server 108 to determine the action to be performed based on the state of the parameter value. In other embodiments, both the determination of a parameter value and the determination of the resultant action may be performed by the remote server 122. Then the remote server 122 may communicate an indication of the action to be performed to the local server 108 for implementation (e.g., as an instruction to the local server 108 for implementation). Although certain embodiments describe sensor data as being communicated to a remote server for processing, sensor data may be processed in other manners as desired for different applications in accordance with various embodiments. For example, the sensor data may be processed locally at the local server 108 with or without additional inputs provided from the remote server 122, remote user device 126, and/or remote satellite 128, as will be discussed further below. In some embodiments, the device platform 106 may communicate directly with the user device 112 (e.g., a smartphone) which can then communicate directly or indirectly with the local server 108, remote network 120, remote user device 126 and/or remote satellite 128. In further embodiments, the wheel 102 (e.g., serving as an antenna) and/or the sensor platform 106 may have a direct communication link with the remote user device 126 or remote satellite 128 (e.g., for purposes of internet access and/or GPS applications).

Figure 2:
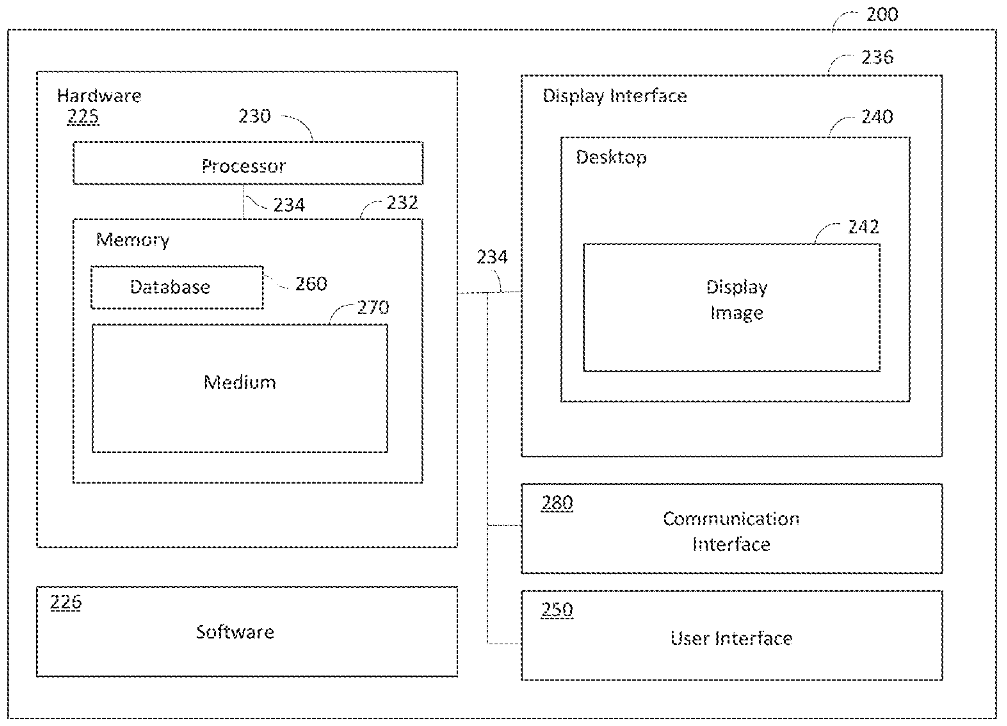
FIG. 2 is a block diagram of an exemplary computing device, in accordance with various embodiments.

FIG. 2 is a block diagram of an exemplary computing device 200, in accordance with various embodiments. As noted above, the computing device 200 may represent exemplary components of a particular local smart wheel server 108, local user device 112, remote server 122, remote user device 126, certain devices of a device platform 106 (e.g., a sensor of the device platform), or remote satellite 128 as discussed above in connection with FIG. 1. Returning to FIG. 2, in some embodiments, the computing device 200 includes a hardware unit 225 and software 226. Software 226 can run on hardware unit 225 (e.g., the processing hardware unit) such that various applications or programs can be executed on hardware unit 225 by way of software 226. In some embodiments, the functions of software 226 can be implemented directly in the hardware unit 225 (e.g., as a system-on-a-chip, firmware, field-programmable gate array ("FPGA"), etc.). In some embodiments, the hardware unit 225 includes one or more processors, such as processor 230. In some embodiments, processor 230 is an execution unit, or "core," on a microprocessor chip. In some embodiments, processor 230 may include a processing unit, such as, without limitation, an integrated circuit ("IC"), an application specific integrated circuit (ASIC), a digital signal processor (DSP), an attached support processor (ASP), a microcomputer, a programmable logic controller ("PLC"), and/or any other programmable circuit. Alternatively, processor 230 may include multiple processing units (e.g., in a multi-core configuration). The above examples are exemplary only, and, thus, are not intended to limit in any way the definition and/or meaning of the term "processor." Hardware unit 225 also includes a system memory 232 that is coupled to processor 230 via a system bus 234. Memory 232 can be a general volatile RAM. For example, hardware unit 225 can include a 32 bit microcomputer with 2 Mbit ROM and 64 Kbit RAM, and/or a number of GB of RAM. Memory 232 can also be a ROM, a network interface (NIC), or any combination of known volatile and/or non-volatile memory devices with appropriate capacities for various desired applications, in accordance with various embodiments.

In some embodiments, the system bus 234 may couple each of the various system components together. It should be noted that, as used herein, the term "couple" is not limited to a direct mechanical, communicative, and/or an electrical connection between components, but may also include an indirect mechanical, communicative, and/or electrical connection between two or more components or a coupling that is operative through intermediate elements or spaces. The system bus 234 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

In some embodiments, optionally, the computing device 200 can also include at least one media output component or display interface 236 for use in presenting information to a user. Display interface 236 can be any component capable of conveying information to a user and may include, without limitation, a display device (not shown) (e.g., a liquid crystal display ("LCD"), an organic light emitting diode ("OLED") display, or an audio output device (e.g., a speaker or headphones). In some embodiments, computing device 200 can provide at least one desktop interface, such as desktop 240. Desktop 240 can be an interactive user environment provided by an operating system and/or applications running within computing device 200, and can include at least one screen or display image, such as display image 242. Desktop 240 can also accept input from a user in the form of device inputs, such as keyboard and mouse inputs. In some embodiments, desktop 240 can also accept simulated inputs, such as simulated keyboard and mouse inputs. In addition to user input and/or output, desktop 240 can send and receive device data, such as input and/or output for a FLASH memory device local to the user, or to a local printer.

In some embodiments, the computing device 200 includes an input or a user interface 250 for receiving input from a user. User interface 250 may include, for example, a keyboard, a pointing device, a mouse, a stylus, a touch sensitive panel (e.g., a touch pad or a touch screen), a position detector, and/or an audio input device. A single component, such as a touch screen, may function as both an output device of the media output component and the input interface. In some embodiments, mobile devices, such as tablets, can be used.

In some embodiments, the computing device 200 can include a database 260 as a datastore within memory 232, such that various information can be stored within database 260. Alternatively, in some embodiments, database 260 can be included within a remote server (not shown) with file sharing capabilities, such that database 260 can be accessed by computing device 200 and/or remote end users. In some embodiments, a plurality of computer-executable instructions can be stored in memory 232, such as one or more computer-readable storage mediums 270 (only one being shown in FIG. 2). Computer-readable storage medium 270 includes non-transitory media and may include volatile and nonvolatile, removable and non-removable mediums implemented in any method or technology for storage of information such as computer-readable instructions, data structures, program modules or other data. The instructions may be executed by processor 230 to perform various functions described herein.

In the example of FIG. 2, the computing device 200 can be a communication device, a storage device, or any device capable of running a software component. For non-limiting examples, the computing device 200 can be but is not limited to a local smart wheel server, a local user device, a remote server, a remote user device, a device of the device platform, a remote satellite, a smartphone, a laptop PC, a desktop PC, a tablet, a Google™ Android™ device, an iPhone®, an iPad®, and a voice-controlled speaker or controller.

The computing device 200 has a communications interface 280, which enables the computing device 200 to communicate with the user and other devices using one or more known communication mediums and communication protocols. Here, the communication mediums and protocols can be but are not limited to, the Internet, an intranet, a wide area network (WAN), a local area network (LAN), a wireless network, Bluetooth, WiFi, and a mobile communication network.

In some embodiments, the communications interface 280 may include any suitable hardware, software, or combination of hardware and software that is capable of coupling the computing device 200 to one or more networks and/or additional devices. The communications interface 280 may be arranged to operate with any suitable technique for controlling information signals using a desired set of communications protocols, services or operating procedures. The communications interface 280 may comprise the appropriate physical connectors to connect with a corresponding communications medium, whether wired or wireless. In some embodiments, the communications interface 280 includes radio frequency (RF) communications circuitry and at least one antenna for transmitting and receiving RF signals in accordance with various known communication protocols (e.g., LTE, 5G, Wifi, etc.).

A communications network may be utilized as a means of communication. In various aspects, the network may comprise local area networks (LAN) as well as wide area networks (WAN) including without limitation the Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., communication nodes) that utilize, at least in part, wireless technology including various protocols and combinations of protocols associated with wireless transmission, data, and devices. The communication nodes can include, for example, wireless devices such as mobile terminals, stationary terminals, base stations, access points, smartphones, and other known devices capable wireless communications via various wireless communication protocols. Further examples of communication nodes can include wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fibre Channel, MIDI, ATA, Serial ATA, PCIExpress, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 280 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 280 may comprise a wireless interface comprising (e.g., including) one or more antennas, transmitters, receivers, transceivers, amplifiers, filters, control logic, and so forth.

In various aspects, the communications interface 280 may provide data communications functionality in accordance with a number of protocols. Examples of protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, 4G-LTE, 5G (new radio) and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

Figure 3A:
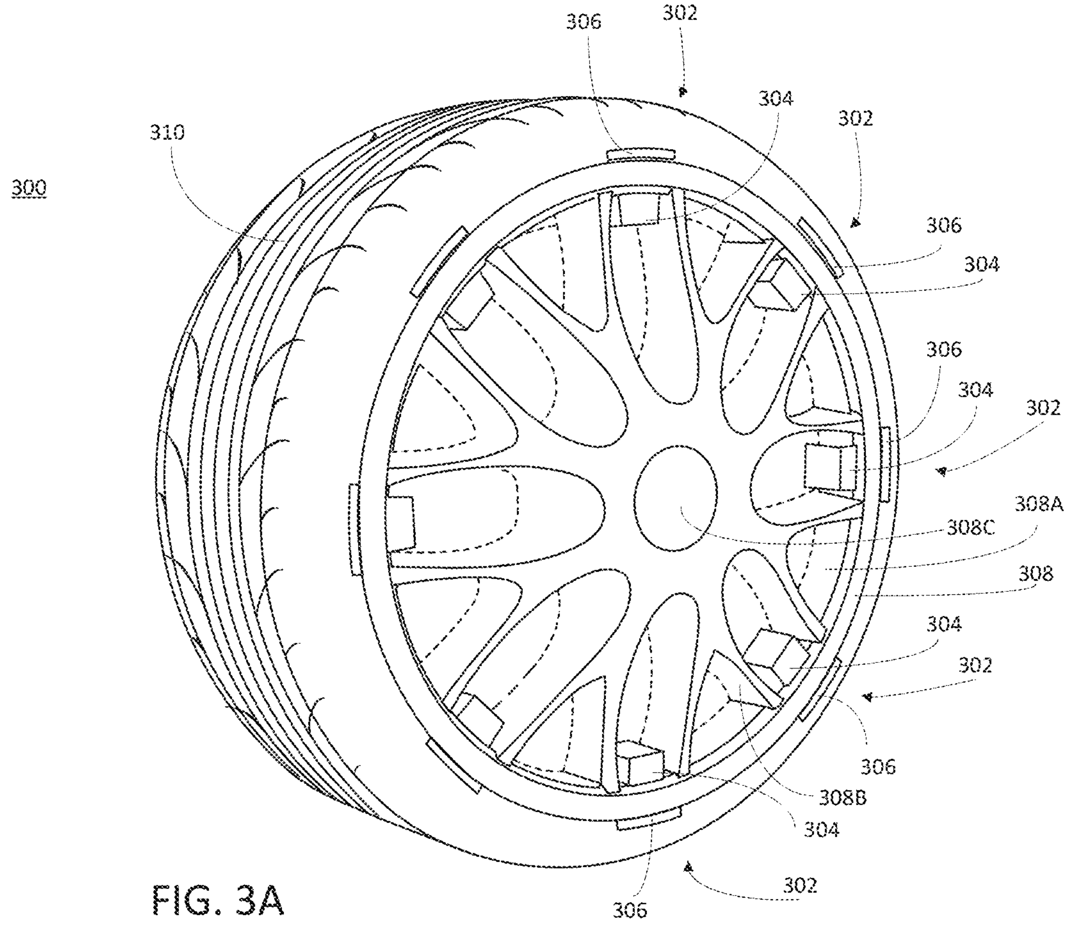
FIG. 3A is a perspective illustration of a smart wheel, in accordance with various embodiments.

FIG. 3A is a perspective illustration of a smart wheel 300, in accordance with various embodiments. The smart wheel 300 may include a device platform 302 of at least one device. More specifically, the device platform 302 may include at least one device that is a sensor within the sensor housing 304 and at least one device that is an energy harvester 306. The device platform may be supported by (e.g., be positioned along) a rotatable component 308 of the smart wheel 300. The rotatable component 308 may include, for example, a rim of the smart wheel 300 within which a circumference of the rotatable component 308 is bound. Although the device platform is illustrated as eight pairs of sensor housings 304 and energy harvesters 306, any number of sensor housings and energy harvesters may be implemented in a device platform as desired for different applications in various embodiments. For example, other embodiments may include multiple sensor housings for each energy harvester and yet further embodiments may include multiple energy harvesters for each sensor housing. Although certain embodiments describe the sensor housing 304 as being located directly on a rim 308A of the smart wheel 300 (e.g., on the rim of the rotatable component 308 of the smart wheel 300), the sensor housing may also be located in other parts of a smart wheel 300 as desired for different applications in various embodiments. For example, the sensor housing (and the constituent sensors) may be located closer to the center of the rotatable component 308, such as along the spokes 308B of the rotatable component 308 or around the center 308C (e.g., proximate a cap) of the rotatable component 308 in particular embodiments.

In various embodiments, the sensor housing may represent one or more sensors together within the sensor housing along with functional modules such as, for example, a battery or other energy storage medium configured to store energy produced by the energy harvester. In certain embodiments, the sensor housing may include a system bus (e.g., a conductive element of a printed circuit board) that connects the various portions of the sensor housing together.

Furthermore, the sensor housing may include other functional modules, such as a communications interface to communicate the sensor data captured by the various sensors of the sensor housing to a local smart wheel server. This communications interface may include, for example, a communications interface for data offload (e.g., via millimeter and/or gigahertz wavelength communications) to a local smart wheel server, to other vehicles, an infrastructure (e.g., a remote network) and/or user devices. As a further example, this communication interface may facilitate wireless communications, such as via Bluetooth, radio frequency, radio wave, ultrasonic, and/or any other type of communication protocol or medium. This communication interface may be configured to communicate with, for example, on board electronic control units (ECUs) and/or advanced driver-assistance (ADAS) systems on a vehicle. Additionally, the sensor housing, optionally, may include a processor or any other circuitry to facilitate the collection, communication, and/or analysis of sensor data produced by the constituent sensors of the sensor housing.

Various types of sensors may be integrated with the sensor housing, in accordance with various embodiments. For example, the sensor housing may include a shock sensor that may sense an amount of electric potential produced by the energy harvester. The shock sensor may be configured to wake up, or otherwise activate the sensors and/or functional modules of the sensor housing when a sufficient amount of electric potential is produced by the energy harvester. Stated another way, the shock sensor may conceptually include the energy harvester such that the shock sensor is configured to transition various sensors and/or functional modules of the sensor housing from a low power or inactive state to a powered on or active state based on the energy harvester producing more than a threshold amount of energy in response to mechanical deformation. In certain embodiments, the energy sensed by the shock sensor may be stored in a battery for standby power when the energy harvester is not producing any energy (e.g., when there is no mechanical stress applied to the energy harvester).

In particular embodiments, the sensor housing may include a height sensor configured to produce barometric pressure sensor data. Accordingly, this height sensor may be a barometric sensor or a barometric air pressure sensor that may measure atmospheric pressure, which may be indicative of an altitude or height. This barometric pressure sensor data may be utilized, for example, to determine a height of a smart wheel from a point of reference such as a road and/or relative to other smart wheels of a vehicle. This may allow for determination of roll over risk or a flat tire. As noted above, height sensors on a smart wheel may be on a rotatable component of a wheel and thus not on a chassis of a vehicle. Thus, such height sensors may be able to provide barometric pressure sensor data on which side (e.g., which smart wheel) initiated a roll over (e.g., when such barometric pressure sensor data is produced and recorded in a continuous or semi continuous manner). Furthermore, road conditions, such as pot holes, can be more accurately sensed by barometric sensor data produced by a smart wheel, in comparison to sensor data produced from a static part of a chassis of a vehicle. In some embodiments, the height sensor is configured to also measure a deflection of an inner tire surface due to vehicle loads or a contact patch. In some embodiments, a distance measuring sensor can be placed into the pressurized portion of a tire. As the tire rotates, the distance of the tire relative to the central rotating rim changes. This periodic change of distance is detectable.

In further embodiments, the sensor housing may include an acoustic sensor configured to produce acoustic sensor data. Accordingly, this acoustic sensor may be any type of acoustic, sound, or vibrational sensor such as a geophone, a microphone, a seismometer, and a sound locator, and the like. The acoustic sensor data may be utilized for audio pattern recognition, such as to sense an audio signature of a brake or a rotor of a rotatable component (e.g., a wheel). This may be used for predicting a vehicle servicing schedule and/or to produce performance optimization data. In some embodiments, the acoustic sensor data may be analyzed to identify and/or monitor for unique signatures for different breaking and wear out conditions, for example.

In various embodiments, the sensor housing may include an image sensor configured to produce image sensor data from variable attenuation of waves. Examples of image sensors may include are semiconductor charge-coupled devices (CCD) or active pixel sensors in complementary metal-oxide-semiconductor (CMOS) or N-type metal-oxide-semiconductor (NMOS) technologies. In various embodiments, a device platform that includes an image sensor may include a lens, or other transparent medium on which the light waves are focused from outside of the sensor housing onto the image sensor. In particular embodiments, this image sensor may include a time of flight (TOF) sensor to capture time of flight data that may characterize a TOF. This TOF sensor may be, for example, an ultrasonic TOF sensor configured to collect ultrasonic TOF sensor data. As a more specific example, an image sensor may function as a camera for determination of a visibility of tire tread depth for assessment of tire performance and optimization. Such an image sensor that captures image data characterizing a tire tread depth may also be positioned in a manner such that image data of a tire tread may be captured (e.g., by having such an image sensor capture image data characterizing a tread depth of a smart tire that the image sensor is located on, or of a tire that the image sensor is not located on). In accordance with various embodiments, the location of the image sensor can be either inside or outside of the rim such that the sensor can image the sidewall of the tire. In either case, the image sensor can be electrically coupled to the energy harvester. As another specific example, an image sensor may include an infrared image sensor for authentication or identification. This infrared sensor may be utilized, for example, to scan for characteristics of a local environment or local object (e.g., a person approaching a vehicle) for authentication.

In particular embodiments, the sensor housing may include a gas sensor configured to produce gas sensor data. This gas sensor may be any type of sensor to monitor and characterize a gaseous atmosphere. For example, the gas sensor may utilize any of a variety of mechanisms for gas detection, such as an electrochemical gas sensor, a catalytic bead gas sensor, a photoionization gas sensor, an infrared point gas sensor, a thermographic gas sensor, a semiconductor gas sensor, an ultrasonic gas sensor, a holographic gas sensor, and the like. These gas sensors may, for example detect for certain types of gases, such as exhaust gases, explosive gases (e.g., for battery failure detection), atmospheric humidity, air quality, particulates, a pH level, and the like.

In particular embodiments, the sensor housing may include a magnetic sensor configured to produce magnetic sensor data. This magnetic sensor maybe, for example, a magnetometer that measures magnetism for navigation using magnetic field maps (e.g., inside a building or within a closed environment).

In additional embodiments, the sensor housing may include an accelerometer sensor configured to produce acceleration sensor data and/or a gyroscope sensor configured to produce gyroscopic sensor data. This acceleration sensor data and/or gyroscopic sensor data may be utilized for navigation, such as to determine an amount of acceleration for the application of emergency brake systems. In certain embodiments, the accelerometer sensor and/or gyroscope sensor may be part of an inertial navigation system (INS) located on a smart wheel.

The energy harvester 306 may be positioned along the rotatable component 308 (e.g., a rim) of the smart wheel 300 in a manner configured to capture a kinetic energy in response to a compressive force acting on a flexible component 310 (e.g., a pneumatic or inflatable tire, tube, etc.) of the smart wheel 300 making contact with a road or object as the rotatable component 308 rotates. In certain embodiments, the energy harvester 306 and/or the device platform 302 may be visible from a lateral side of a vehicle or smart wheel 300 (e.g., adjacent a lateral sidewall of the vehicle or smart wheel 300). However, in other embodiments, the energy harvester 306 and/or the device platform 302 may not be visible from the lateral side of the vehicle or smart wheel 300. The energy harvested by the energy harvester 306 may be used to power various components of the device platform 302, such as various sensors and/or communication interfaces within the sensor housing 304, as described in further detail below.

In various embodiments, the energy harvester 306 may be positioned on a side wall of the rotatable component 308. For example, the energy harvester 306 may be positioned between a bead area of the flexible component 310 (e.g., a tire, tube, belt, etc.) and the rotatable component 308 (e.g., a rim, shaft, etc.). Accordingly, the flexible component 310 may be mounted on the rotatable component 308. The energy harvester 306 may generate energy resulting from a compressive force acting on the bead area of the flexible component 310 (e.g., tire, tube, etc.) as the vehicle travels over a surface (e.g., a road).

Figure 3B:
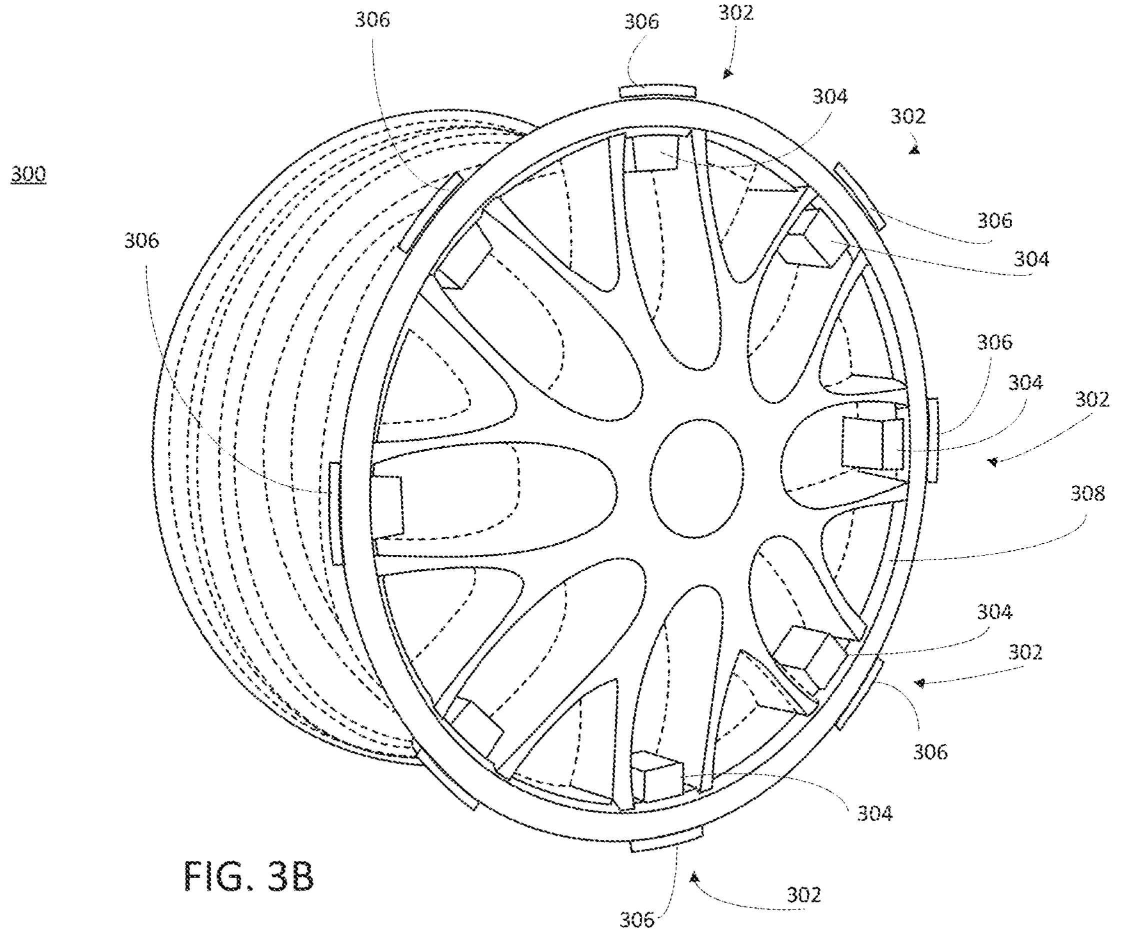
FIG. 3B is a perspective illustration of the smart wheel without the flexible component, in accordance with various embodiments.

FIG. 3B is a perspective illustration of the smart wheel 300 without the flexible component, in accordance with various embodiments. As illustrated, the energy harvester 306 may be positioned around a circumference of the rotatable component 308. Accordingly, the energy harvester 306 may generate energy resulting from a compressive force of a moving object (e.g., a vehicle) acting on the bead area of the tire mounted on the rotatable component 308. In some embodiments, the compressive force may be due to loading (e.g., acceleration, deceleration, etc.). As such, the location of the compressive force may vary depending on the loading. In further embodiments, the energy harvester 306 may capture a kinetic energy of the transport moving in response to the rotatable component 308 rotating. Accordingly, the energy harvester 306 may generate energy when mechanical stress is applied to the energy harvester 306.

Figure 4A:
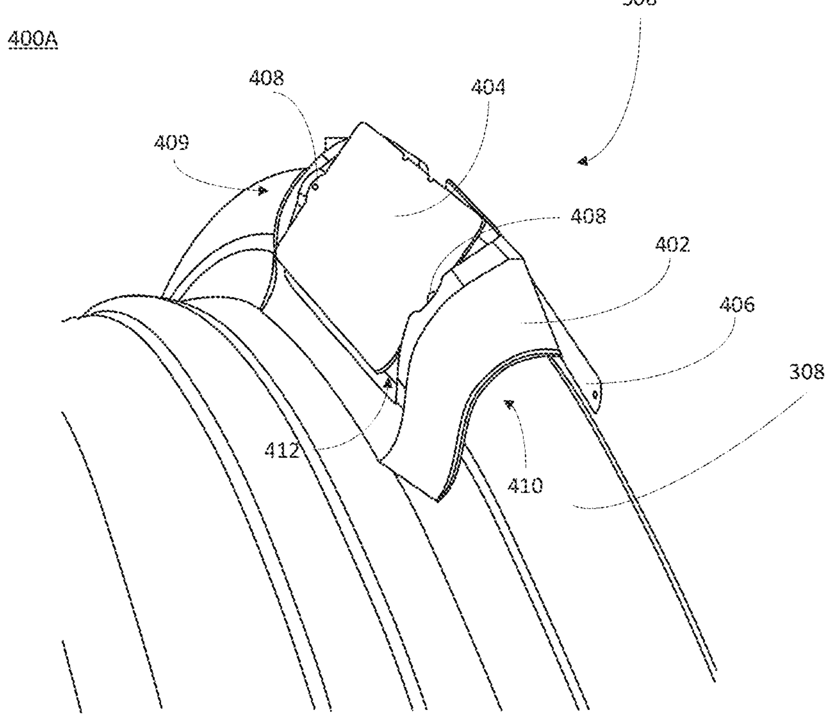
FIG. 4A is a perspective illustration of the energy harvester, in accordance with various embodiments.

FIG. 4A is a perspective illustration 400A of the energy harvester 306, in accordance with various embodiments. The energy harvester 306 may be positioned along a circumference of the rotatable component 308 (e.g., the rim). The energy harvester 306 may include a substrate 402 that is configured to contact and be fixedly coupled to the rotatable component 308. The substrate 402 may support a piezoelectric component 404. The piezoelectric component may be a transducer that converts a mechanical deformation into energy, in accordance with some embodiments.

The energy harvester 306 may include an electrical conduction component 406 configured to channel and offload the energy produced by the piezoelectric component 404. This electrical conduction component may be connected with other devices of the device platform (e.g., sensors of the sensor housing) to provide power to the other devices of the device platform. In certain embodiments, this electrical conduction component 404 may be composed of a flexible conductive material such as brass or copper. The energy harvester 306 may also include location pins 408 based on which the piezoelectric component 404 may be secured to the substrate 402. For example, the piezoelectric component 404 may include a wingtip feature 409 with an open hole through which the location pins 408 are configured to pass through in a secure manner to secure the piezoelectric component to the substrate 402, as described in further detail below.

In various embodiments, the substrate 402 may include a three dimensional curved bottom surface 410 that interfaces with the rotatable component 308 (e.g., rim) of the smart wheel. This three dimensional curved bottom surface 410 may include a compound curve in three dimensions (e.g., length, height, and width). As noted above, each of the length, height, and width may define dimensions or axes orthogonal to each other in three dimensional physical space. For example, the length may be along an axis orthogonal to the height, which may be along an axis orthogonal to the width, which may be along an axis orthogonal to the length. In certain embodiments, the length, height, and width may be referred to as an x-axis, a z-axis, and a y-axis, respectively. Also, the substrate 402 may include a curved staging surface 412 (e.g., a micro cavity or depression) opposite the bottom surface 410. This staging surface 412 (e.g., a top surface) may also be referred to as a top surface of the substrate. In some embodiments, the curved staging surface 412 is curved in only two dimensions (e.g., two of a length, a height and a width), as described in further detail below. When a force is applied onto the piezoelectric component 404, the piezoelectric component 404 will deform and conform against the two-dimensional curved staging surface 412, which limits the amount of deformation of the piezoelectric component 404. Accordingly, the piezoelectric component 404 can sit on the rotatable component 308 via the three dimensional curved bottom surface 410. Also, the rectangular piezoelectric component 404 may be configured to bend within the two-dimensional curved staging surface 412. In certain embodiments, the two-dimensional curved staging surface 412 may be referred to as a convex surface. Accordingly, the two-dimensional curved staging surface 412 may include (e.g., be) a convex surface to which the piezoelectric component 404, with a straight (e.g., non-curved or flat) shape or surface, may be attached. In certain embodiments, the substrate 402 may be referred to as a teardrop support. Accordingly, the piezoelectric component 404 may be bent against the convex two-dimensional curved staging surface 412 to generate compressive bending strain on the piezoelectric component 404. Stated another way, the piezoelectric component 404 may incur strain such that the piezoelectric component 404 is bent to conform against the convex two-dimensional curved staging surface 412 (e.g., bends against the convex surface) to generate electrical charge (e.g., via piezoelectric material layer mechanical deformation). Accordingly, the substrate 402 may be structured to enable a strain (e.g., relative motion/deflection) of the piezoelectric component 404 when placed between the tire and rotatable component 308 of a wheel (e.g., by the tire pushing down against the piezoelectric component 404).

In various embodiments, the piezoelectric component 404 may include a piezoelectric material that is at least one of a crystal and semiconductor material or a polymer and organic material. Examples of a crystal and semiconductor material may include: polyvinylidene fluoride, gallium phosphate, sodium bismuth titanate, lead zirconate titanate, quartz, berlinite (AlPO4), sucrose (table sugar), rochelle salt, topaz, tourmaline-group minerals, lead titanate (PbTiO3), langasite (La3Ga5SiO14), gallium orthophosphate (GaPO4), lithium niobate (LiNbO3), lithium tantalate (LiTaO3), any of a family of ceramics with perovskite, tungsten-bronze, potassium niobate (KNbO3), sodium tungstate (Na2WO3), Ba2NaNb5O5, Pb2KNb5O15, sodium potassium niobate ((K,Na) NbO3) (e.g., NKN, or KNN), bismuth ferrite (BiFeO3), sodium niobate (NaNbO3), barium titanate (BaTiO3), bismuth titanate (Bi4Ti3O12), sodium bismuth titanate (NaBi(TiO3)2), zincblende crystal, GaN, InN, AlN, and ZnO. Examples of a polymer and organic material may include: polyvinylidene fluoride (PVDF) and its copolymers, polyamides, and parylene-C, polyimide and polyvinylidene chloride (PVDC), and diphenylalanine peptide nanotubes (PNTs).

In various embodiments, the substrate 402 may include at least one material such as: brass, steel, spring steel sheet (SS), carbon fiber, aluminum and its alloys, titanium and its alloys, S2 fiberglass rods, glass fiber reinforced polymer laminate (Fiberite HMS/33), fiberglass, kevlar laminate, carbon fiber reinforced materials, aramid fiber reinforced materials, fiber-reinforced plastic (FRP), copper, and alloys.

Figure 4B:
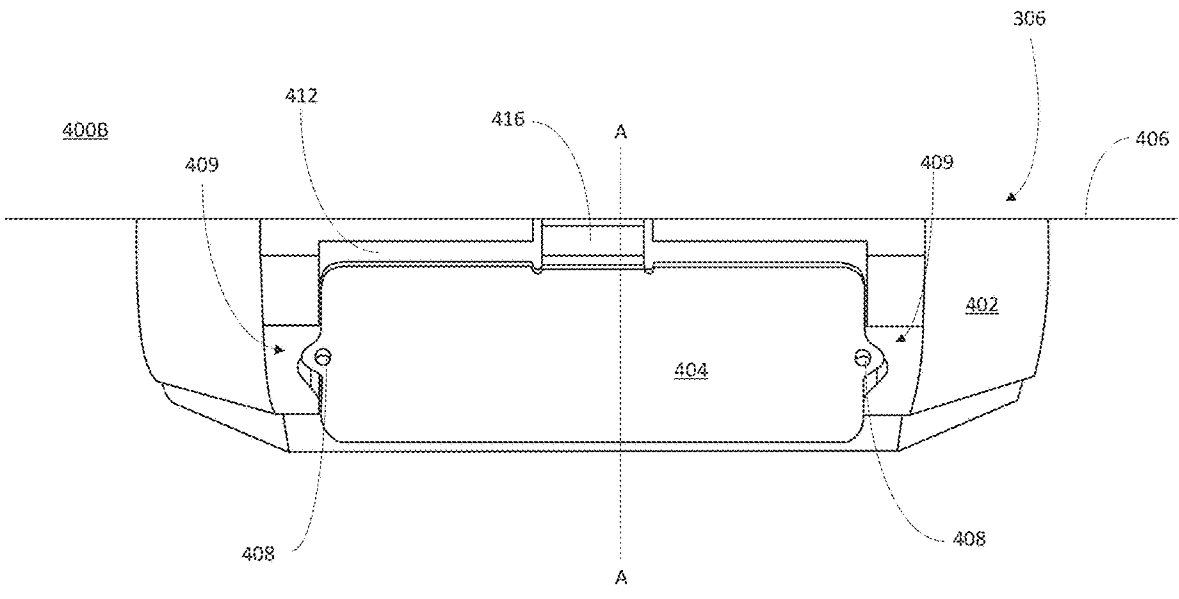
FIG. 4B is a top view illustration of the energy harvester, in accordance with various embodiments.

FIG. 4B is a top view illustration 400B of the energy harvester 306, in accordance with various embodiments. The top view illustration 400B illustrates how the electrical conduction component 406 may be connected with the piezoelectric component 404 via an interconnect 416. Stated another way, the interconnect 416 may be a flexible structure that connects the piezoelectric component 404 to the electrical conduction component 406 so that the electrical conduction component 406 may channel and offload the energy produced by the piezoelectric component 404. This electrical conduction component may be connected with other devices of the device platform to provide power to the other devices of the device platform.

Also, the top view illustration 400B illustrates how the substrate 402 may also include location pins 408 which secure the piezoelectric component 404 to the substrate 402. For example, the piezoelectric component 404 may include a wingtip feature 409 with an open hole through which the location pins 408 are configured to pass to secure the piezoelectric component to the substrate 402. Also illustrated is the two-dimensional curved staging surface 412 within a cavity formed by the substrate 402. FIG. 4B further illustrates a cross sectional line A-A which will be referenced further below in connection with FIG. 5A and FIG. 5B.

Figure 4C:
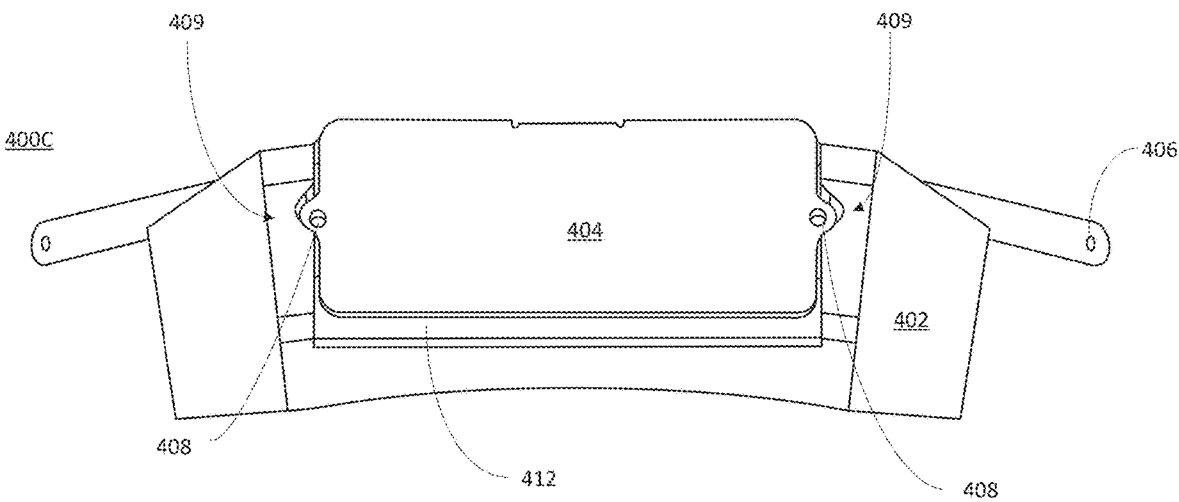
FIG. 4C is a front view illustration of the energy harvester, in accordance with various embodiments.

FIG. 4C is a front view illustration 400C of the energy harvester 306, in accordance with various embodiments. The front view illustration 400C illustrates how the electrical conduction component 406 may be generally behind the substrate 402. Also, the front view illustration 400C illustrates another view of how the substrate 402 may also include location pins 408 for securing the piezoelectric component 404 to the substrate 402. For example, the piezoelectric component 404 may include the wingtip feature 409 with an open hole through which the location pins 408 are configured to pass to secure the piezoelectric component to the substrate 402. Also illustrated is the two-dimensional curved staging surface 412 within a cavity formed by the substrate 402.

Figure 4D:
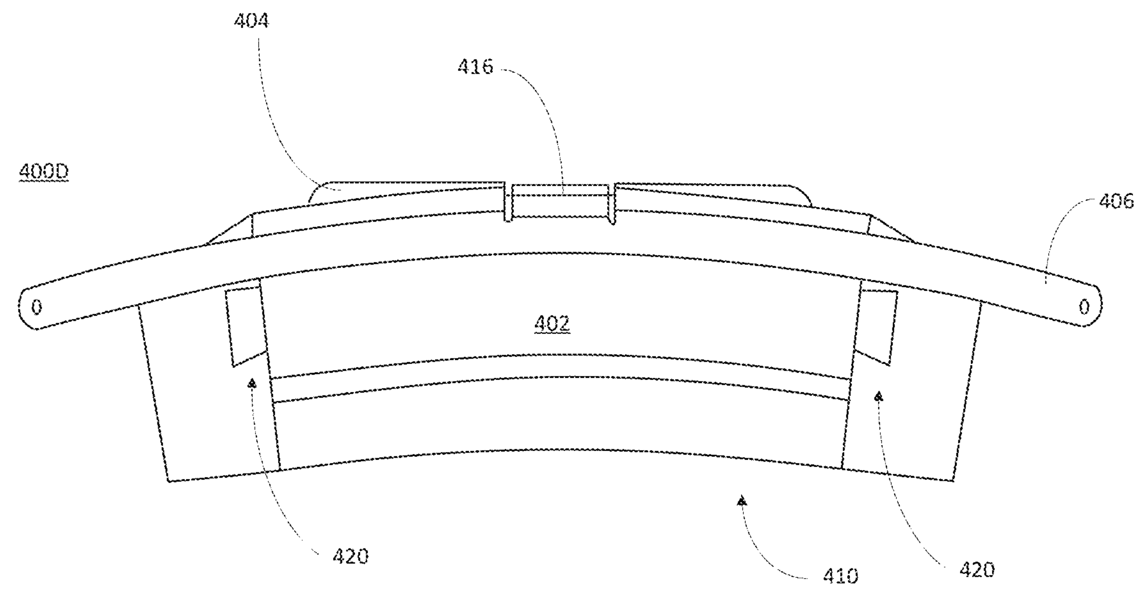
FIG. 4D is a back view illustration of the energy harvester, in accordance with various embodiments.

FIG. 4D is a back view illustration 400D of the energy harvester 306, in accordance with various embodiments. The back view illustration 400D illustrates how the electrical conduction component 406 may be generally behind the substrate 402 (e.g., in the foreground in the back view illustration 400D). The back view illustration 400D also includes the three-dimensional curved bottom surface 410 and physical interconnection features 420 on the substrate 402. This physical interconnection features 420 may be utilized to physically connect different substrates 402 together, as will be discussed in further detail below. The illustrated physical interconnection features 420 may be convex physical interconnection features 420 configured to interconnect with concave physical interconnection features (not illustrated in FIG. 4D).

Figure 4E:
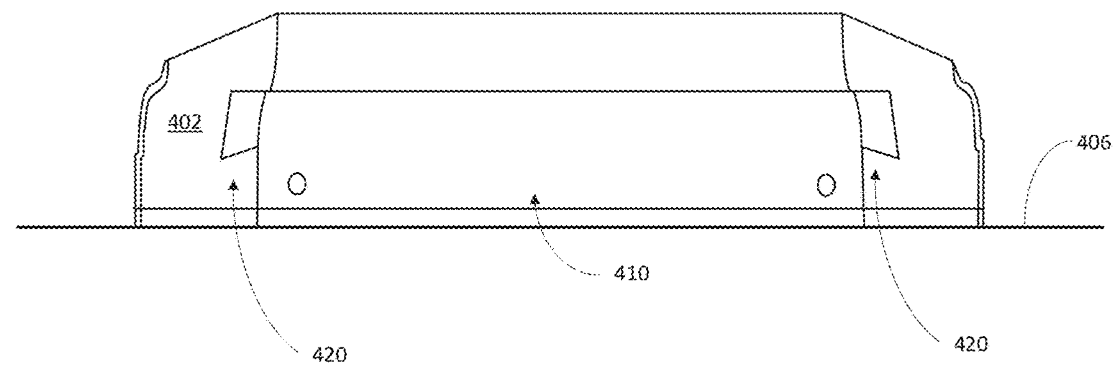
FIG. 4E is a bottom view illustration of the energy harvester, in accordance with various embodiments.

FIG. 4E is a bottom view illustration 400E of the energy harvester 306, in accordance with various embodiments. The bottom view illustration 400E illustrates how the electrical conduction component 406 may be generally behind the substrate 402. The bottom view illustration 400E also includes the three-dimensional curved bottom surface 410 and physical interconnection features 420 on the substrate 402. As noted above, this physical interconnection features 420 may be utilized to physically connect different substrates 402 together, as will be discussed in further detail below. The illustrated physical interconnection features 420 may be convex physical interconnection features 420 configured to interconnect with concave physical interconnection features (not illustrated in FIG. 4E).

Figure 4F:
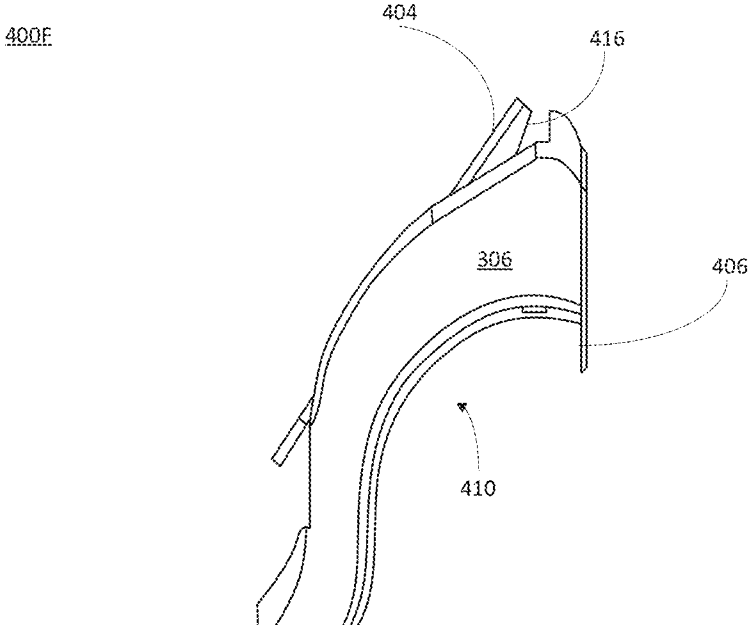
FIG. 4F is a right side view illustration of the energy harvester, in accordance with various embodiments.
Figure 4G:
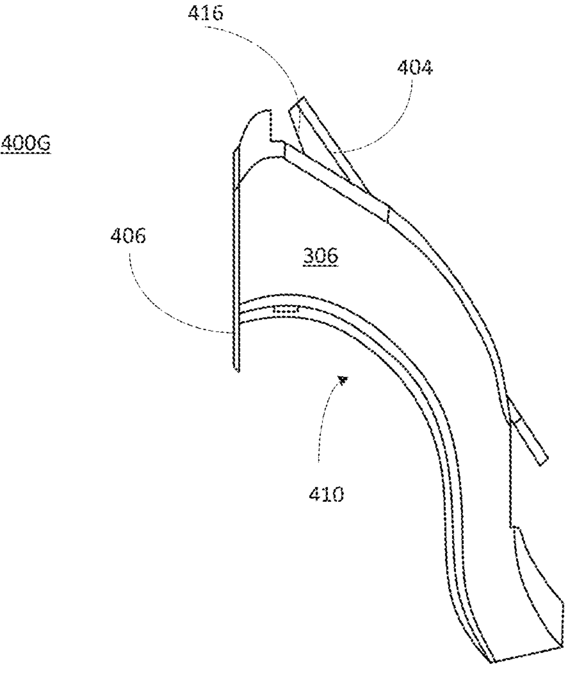
FIG. 4G is a left side view illustration of the energy harvester, in accordance with various embodiments.

FIG. 4F is a right side view illustration 400F of the energy harvester 306, in accordance with various embodiments. Also, FIG. 4G illustrates a left side view illustration 400G of the energy harvester 306, in accordance with various embodiments. A combination of both FIG. 4F and FIG. 4G may be referred to as the side view figures. The side view figures illustrate the electrical conduction component 406 that may be connected with the piezoelectric component 404 via the interconnect 416. Stated another way, the interconnect 416 may be a flexible structure that connects the piezoelectric component 404 to the electrical conduction component 406 so that the electrical conduction component 406 may channel and offload the energy produced by the piezoelectric component 404. This electrical conduction component may be connected with other devices of the device platform to provide power to the other devices of the device platform. The side view figures also illustrate the three dimensional curved bottom surface 410

Figure 5A:
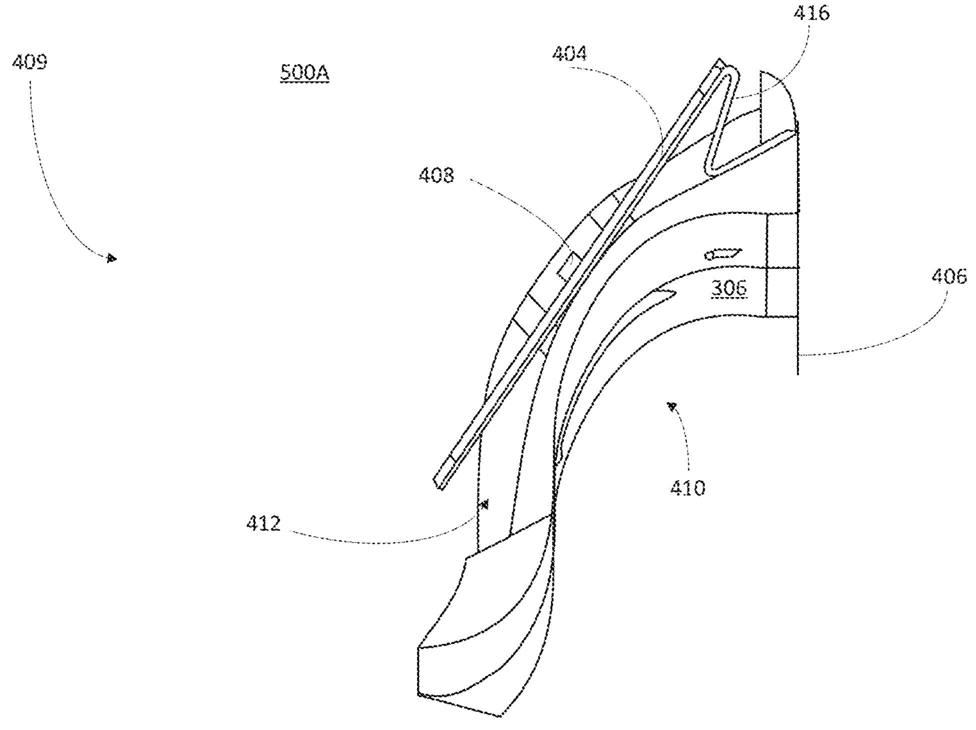
FIG. 5A is a side cross sectional view of the energy harvester with the piezoelectric component in an unbiased state, in accordance with various embodiments.

FIG. 5A is a side cross sectional view 500A of the energy harvester 306 with the piezoelectric component 404 in an unbiased state, in accordance with various embodiments. The side cross sectional view 500A may be across the cross section A-A illustrated above in FIG. 4B. Returning to FIG. 5A, the side cross sectional view 500A illustrates how the electrical conduction component 406 may be connected with the piezoelectric component 404 via the interconnect 416. Thus, the interconnect 416 may be a flexible structure that connects the piezoelectric component 404 to the electrical conduction component 406 so that the electrical conduction component 406 may channel and offload the energy produced by the piezoelectric component 404. This electrical conduction component may be connected with other devices of the device platform to provide power to the other devices of the device platform.

Also, the side cross sectional view 500A illustrates how the substrate 402 may also include location pins 408 based on which the piezoelectric component 404 may be secured to the substrate 402. Also illustrated is the two-dimensional curved staging surface 412 within a cavity formed by the substrate 402. The three-dimensional curved bottom surface 410 is illustrated below and opposite the two-dimensional curved staging surface 412. As shown in FIG. 5A, the two-dimensional curved staging surface 412 is curved in two dimensions (e.g., the width and height dimensions but not the length dimension) to form a 2-D convex surface. In contrast, the three-dimensional bottom surface 410 is curved in each of the width, height and length dimensions. In some embodiments, the 3-D bottom surface 410 has an S-shape cross-section, as shown in FIG. 5A. The piezoelectric component 404 in an unbiased state may be flat (e.g., unbent) in the unbiased state as it may not experience sufficient strain to be biased.

Figure 5B:
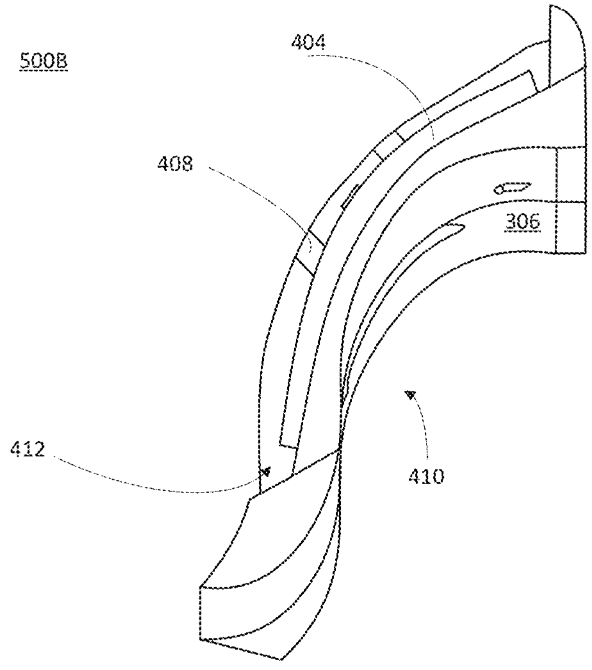
FIG. 5B is a side cross sectional view of the energy harvester with the piezoelectric component 404 in a biased state, in accordance with various embodiments.

FIG. 5B is a side cross sectional view 500B of the energy harvester 306 with the piezoelectric component 404 in a biased state, in accordance with various embodiments. The side cross sectional view 500B may be across the cross section A-A illustrated above in FIG. 4B. Returning to FIG. 5B, the piezoelectric component 404 in a biased state may experience a sufficient amount of strain to bend the piezoelectric component such that it conforms to the two-dimensional curved staging surface 412. As noted above, the piezoelectric component 404 may alternate between the biased and unbiased states as a rotatable component turns. Thus, the load from a wheel or vehicle may displace the piezoelectric component and generate a charge (e.g., electrical energy). In some embodiments, the energy harvester can generate continuous power as the rotatable component rotates. In certain embodiments, this energy may be in the form of an alternating current (AC) signal, which can be rectified into a direct current (DC) signal. Stated another way, the bending strain experienced at the piezoelectric component may generate energy (e.g., an alternating current (AC) voltage) with a frequency proportional to the rotational frequency of the wheel. In some embodiments, the AC signal is rectified by a rectification circuit contained within the sensor housing 304.

Figure 6:
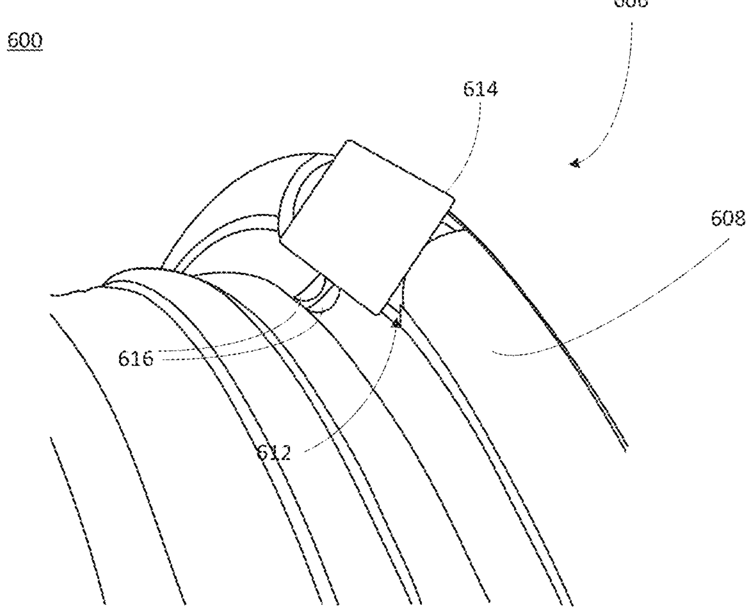
FIG. 6 is a perspective illustration of an integrated energy harvester, in accordance with various embodiments.

FIG. 6 is a perspective illustration 600 of an integrated energy harvester 606, in accordance with various embodiments. The integrated energy harvester 606 may be positioned along a circumference of the rotatable component 608 (e.g., the rim) without need for a substrate. Stated another way, the integrated energy harvester 606 may be integrated within the rotatable component 608 and thus without a separate physical substrate structure. The rotatable component 608 may include a curved staging surface 612 formed on the rotatable component 608 (e.g., a micro cavity or depression formed on the rotatable component 608). In some embodiments, the curved staging surface 612 is curved in only two dimensions (e.g., the height and width directions but not the length direction) so as to form a two-dimensional convex surface 612. The piezoelectric component 614 may incur strain to deform and conform to the two-dimensional curved staging surface 612. Also, this two-dimensional curved staging surface 612 may be different than the rest of the rotatable component 608 which may have a three dimensional curved surface. The rectangular piezoelectric component 614 may be configured to bend within the two-dimensional curved staging surface 612. In certain embodiments, the two-dimensional curved staging surface 612 may be referred to as a convex surface. Accordingly, the two-dimensional curved staging surface 612 may include (e.g., be) a convex surface to which the piezoelectric component 614, with a straight (e.g., non-curved or flat) shape or surface, may be more easily and securely attached compared to a 3-D curved surface. The piezoelectric component 614 may be bent against the convex two-dimensional curved staging surface 612 to generate compressive bending strain on the piezoelectric component 614. Stated another way, the piezoelectric component 614 may incur strain such that the piezoelectric component is bent to conform against the convex two dimensional curved staging surface 612 (e.g., bends against the convex surface) to generate electrical charge (e.g., via piezoelectric material layer mechanical deformation). Thus, the convex two-dimensional curved staging surface 612 of the rotatable component 608 may be structured to enable a strain (e.g., relative motion/deflection) of the piezoelectric component 614 when placed between the tire and rotatable component 608 of a wheel (e.g., by the tire pushing down against the piezoelectric component 614).

The integrated energy harvester 606 may include an electrical conduction component 616 configured to channel and offload the energy produced by the piezoelectric component 614. This electrical conduction component may be connected to leads of a rechargeable battery contained within a sensor housing 304 (FIGS. 3A and 3B) of the device platform to provide power to the sensor(s) within the sensor housing 304. In certain embodiments, this electrical conduction component 616 may be composed of a flexible conductive material such as brass or copper. The integrated energy harvester 606 may also include location pins (not illustrated) to secure the piezoelectric component 614 to the convex two-dimensional curved staging surface 612 of the rotatable component 608.

In certain embodiments, the piezoelectric component 614 may be formed with different types of layers. For example, one type of layer of the piezoelectric component 614 may be a load-backing layer. This load-backing layer may be, for example, a steel plate with sufficient load flexibility to keep the piezoelectric component together. Another type of layer of the piezoelectric component may be a piezoelectric material layer that may be configured to generate electrical charge via mechanical deformation. Yet another type of layer of the piezoelectric component may be an electrode layer to harvest electrical energy (e.g., electrical charge) from the piezoelectric material layer.

In some embodiments, the load backing layer, when bonded with the piezo ceramic material of the piezoelectric material layer, ensures that the piezo ceramic material does not crack or buckle under the "compressive and/or tensile stresses" that is exerted on the piezo ceramic material during bending. In various embodiments, the electrode layers may be electrically bonded to other layers of the piezoelectric component (e.g., to the load backing layer and/or the piezoelectric material layer). Also, the load backing layer may be electrically and/or mechanically bonded to the piezoelectric material layer. The assembly of all the layers of a piezoelectric component may form the piezoelectric component (which may be referred to as a piezoelectric electrode assembly in certain embodiments). In further embodiments, the piezoelectric component may be encapsulated in a protective coating, such as a heat shrinkable film or a polymer to protect the piezoelectric component from environmental degradation.

Figure 7A:
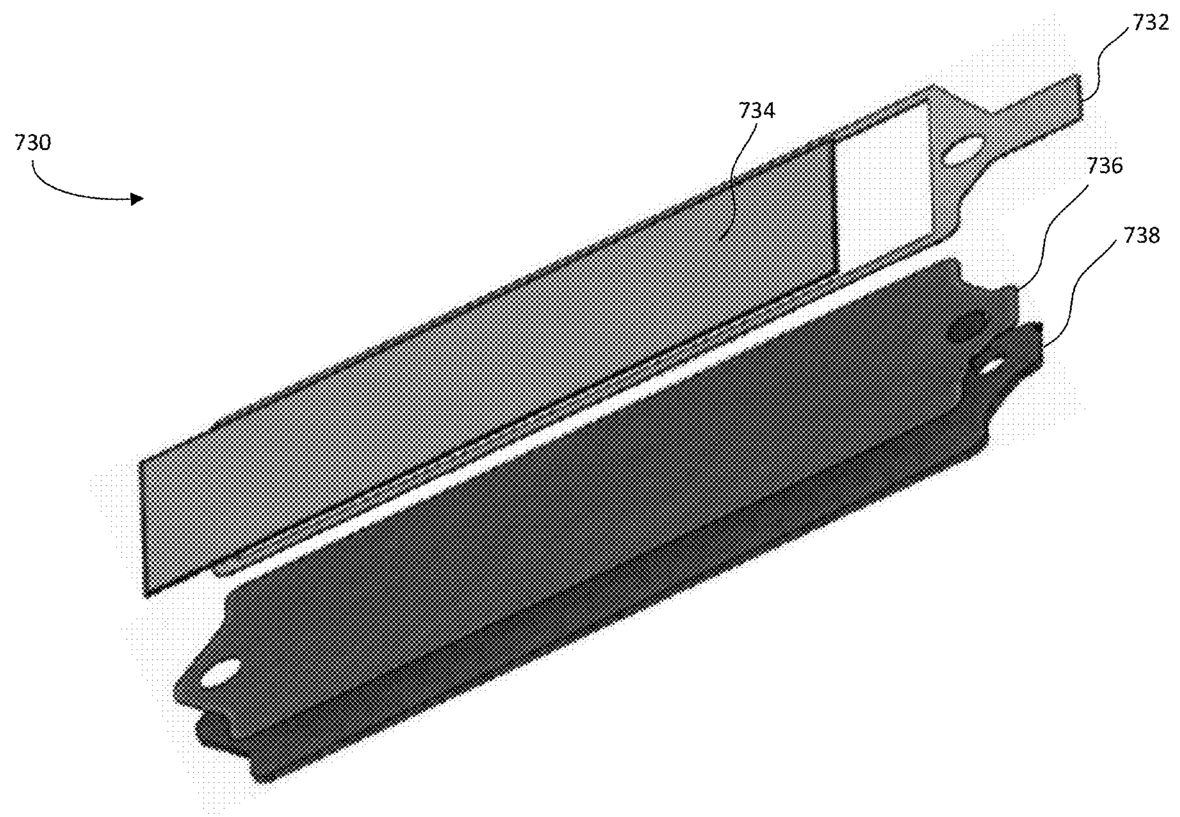
FIG. 7A illustrates another example of a piezoelectric component, according to an embodiment of the present disclosure.

FIG. 7A illustrates an example of a piezoelectric component 730, according to an embodiment of the present disclosure. In this example, the piezoelectric component 730 comprises an electrode layer 732, a piezoelectric material layer 734, a conductive bonding layer 736, and a load backing layer 738. Additional layers may also be implemented but are not shown for ease of illustration.

The conductive bonding layer 736 may be referred to as a bonding layer used to bond the piezoelectric material layer 734 and the load backing layer 738. In one example, the conductive bonding layer 736 comprises metal powders and resin. In another example, the conductive bonding layer 736 is vertically above and in direct contact with the load backing layer 738, and the piezoelectric material layer 734 is vertically above the conductive bonding layer 736 while the piezoelectric material layer 734 is horizontally surrounded by the electrode layer 732. In one example, the load backing layer 738 comprises a fiber reinforced composite material with a high elastic modulus, and the conductive bonding layer 736 is used to transfer the effect produced by the high elastic modulus from the fiber reinforced composite material to the piezoelectric material layer 734. In this way, when the piezoelectric component 730 deforms under a mechanical strain, the piezoelectric component 730 may "bounce back" to its original shape quickly and more often (i.e., for many more cycles compared to when steel is used for the load backing layer 738). Consequently, electrical power may be generated more efficiently and for more cycles in the energy harvester 306.

In some embodiments, the load backing layer 738 comprises the fiber reinforced composite material and a surface layer. In one example, the surface layer is a resin layer. In another example, when the conductive bonding layer 736 is vertically above and in direct contact with the load backing layer 738, the surface layer is between the fiber reinforced composite material and the conductive bonding layer 736. In some embodiments, the surface layer is removed from the load backing layer 738 such that the fiber reinforced composite material in the load backing layer 738 is exposed and in direct contact with the conductive bonding layer 736. In this way, the elastic modulus in the fiber reinforced composite material may be higher after the surface layer is removed than the elastic modulus in the fiber reinforced composite material before the surface layer is removed. In yet another example, the surface layer is removed using a mechanical etching process or a laser etching process.

Figure 7B:
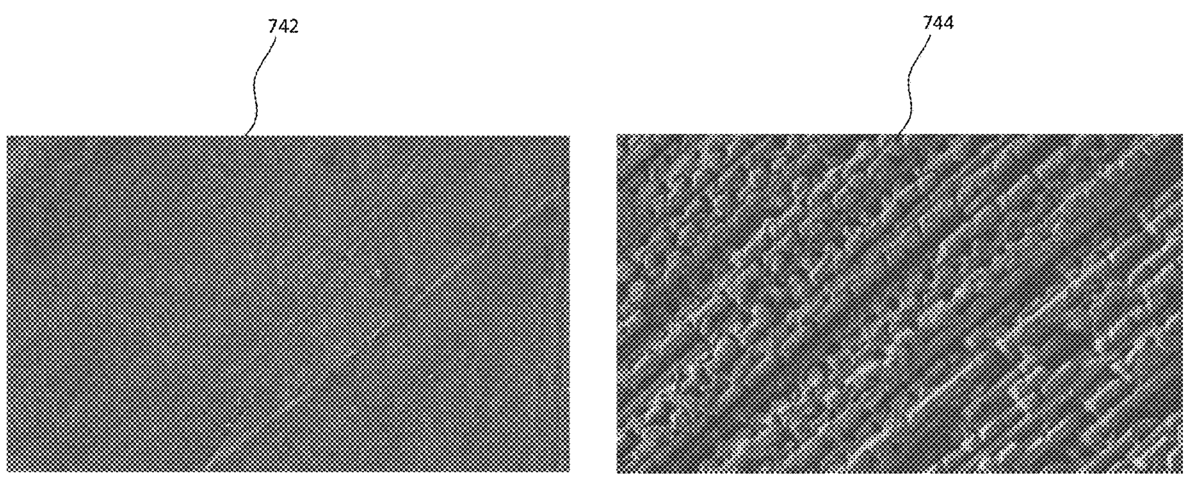
FIG. 7B illustrates a top view of a CFC material with a surface layer and a CFC material with the surface layer removed, in accordance with various embodiments.

FIG. 7B illustrates a top view of a CFC material 742 with a covered surface layer and a CFC material 744 with the surface layer removed. In some embodiments, the covered surface layer of the CFC material 742 is a resin layer. Removing the covered surface layer of the CFC material 742 may increase the elastic modulus. Therefore, the CFC material 744 with the surface layer removed may experience a higher elastic modulus. In this way, when the CFC material 744 is directly connected with a conductive bonding layer which is directly connected with a piezoelectric layer, the piezoelectric layer can be back to its original shape quickly after it deforms under a mechanical strain. Additionally, removing the surface (resin) layer of the CFC material 744 can provide better adhesion and bonding between the load backing layer 738 and the conductive bonding layer 736.

Figure 8A:
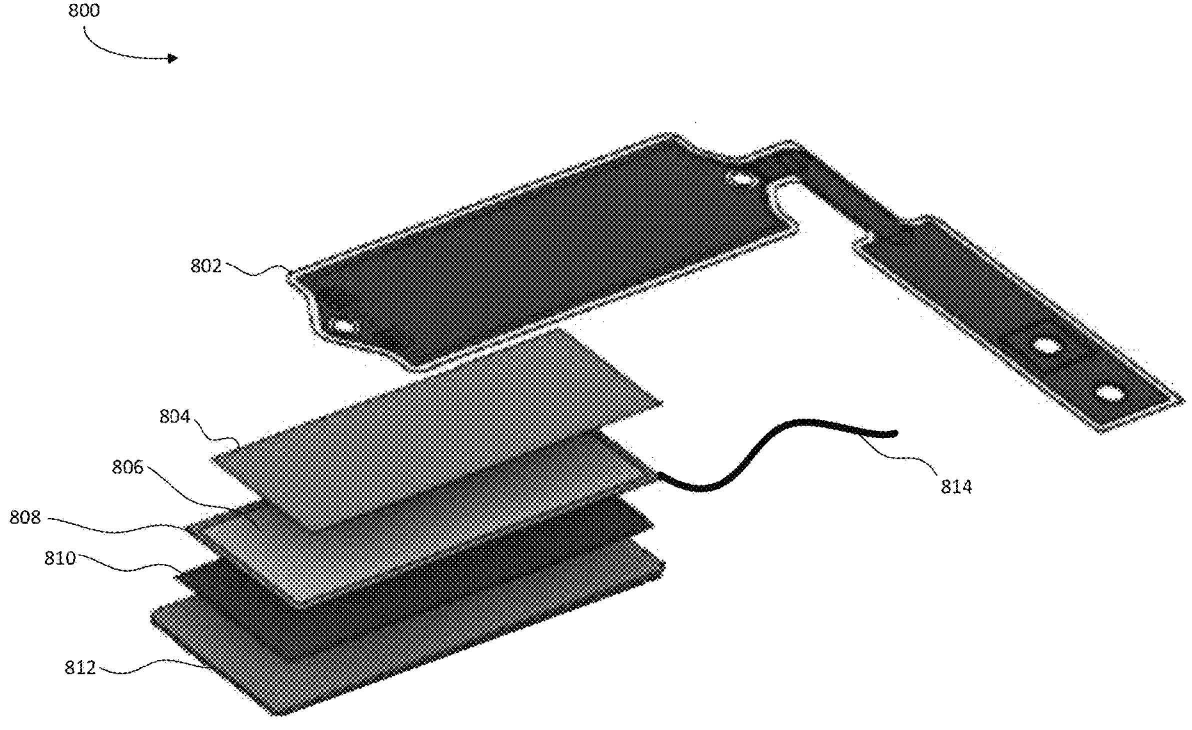
FIG. 8A illustrates yet another example of a piezoelectric component, according to an embodiment of the present disclosure.

FIG. 8A illustrates yet another example of a piezoelectric component 800, according to an embodiment of the present disclosure. In this example, the piezoelectric component 800 comprises two electrode layers 802 and 808, a piezoelectric material layer 806, two conductive bonding layers 804 and 810, a load backing layer 812, and an electrical wire 814 connected to the electrode layer 808. Additional layers may also be implemented but are not shown for ease of illustration. The functions of the piezoelectric material layer 806, the electrode layer 808, the conductive bonding layer 810, and the load backing layer 812 are described above with reference to FIG. 7B and are, therefore, not repeated here. Additional layers included in this embodiment are the electrode layer 802, the conductive bonding layer 804, and the electrical wire 814, and are described in detail herein.

The electrode layer 802 may be used to indirectly contact (e.g., via the conductive bonding layer 804) the piezoelectric material layer 806 to harvest electrical charge from the piezoelectric material layer 806. In some embodiments, the electrode layers 802 and 808 may represent different circuits with different electric potentials, such that there is an electric potential difference between the electrode layers 802 and 808. The electric potential difference between the electrode layers 802 and 808 may be then used to provide power to devices of a smart wheel sensor system through the electrical wire 814.

The conductive bonding layers 804 may be used to bond the piezoelectric material layer 806 and the electrode layer 802. In some embodiments, the conductive bonding layers 804 comprises metal powders and resin, and is vertically above and in direct contact with the piezoelectric material layer 806.

Figure 8B:
FIG. 8B illustrates a cross sectional view of a piezoelectric component, according to an embodiment of the present disclosure
Figure 8B:

FIG. 8B illustrates a cross sectional view of the piezoelectric component 800, according to an embodiment of the present disclosure. The functions of the electrode layers 802 and 808, the piezoelectric material layer 806, the conductive bonding layers 804 and 810, and the load backing layer 812 are described above with reference to FIG. 8A and are, therefore, not repeated here. In some embodiments, the piezoelectric material layer 806 is surrounded by the electrode layer 808 with a gap between an inner peripheral edge of the electrode layer 808 and outer peripheral edge of the piezoelectric material layer 806 to prevent a short circuit between the layers 806 and 808. In some embodiments, the gap is 100 μm or more.

Figure 9A:
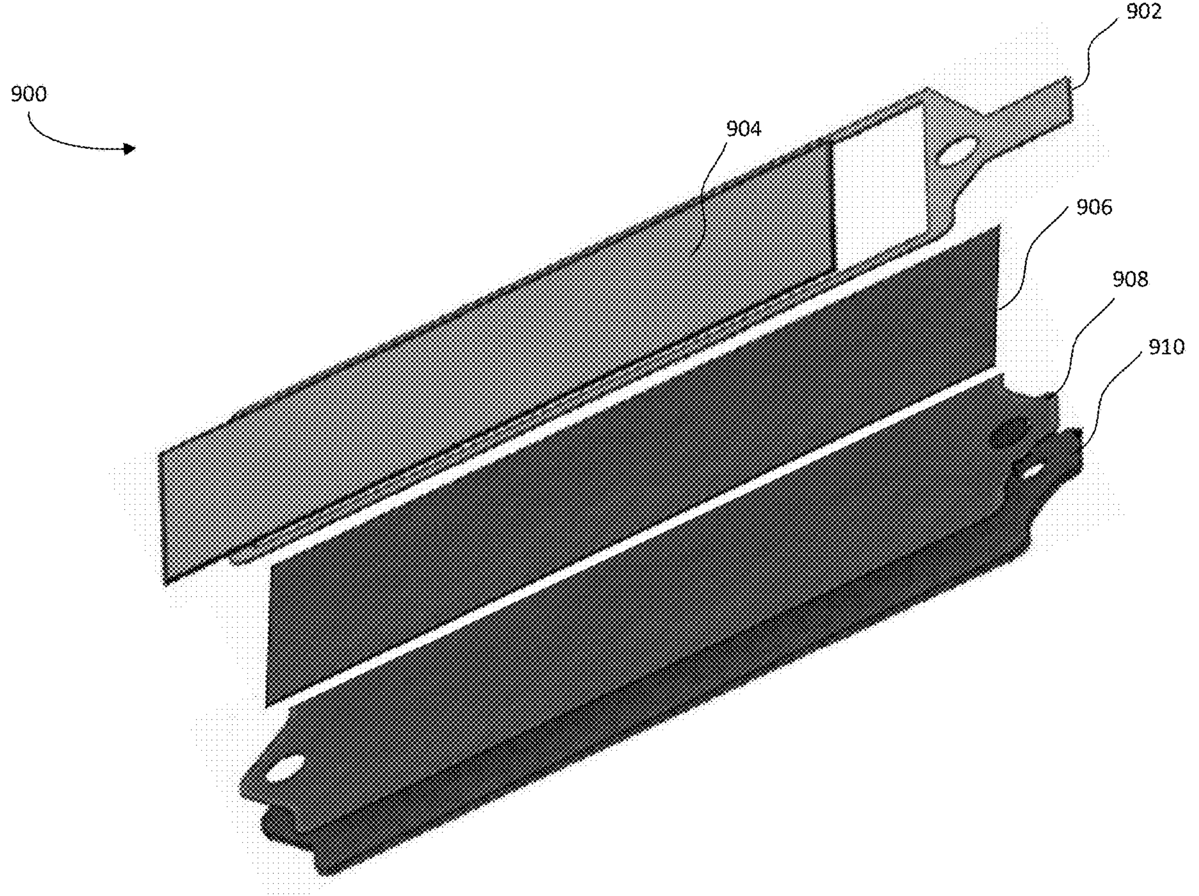
FIG. 9A illustrates still another example of a piezoelectric component, according to an embodiment of the present disclosure.

FIG. 9A illustrates still another example of a piezoelectric component 900, according to an embodiment of the present disclosure. In this example, the piezoelectric component 900 comprises an electrode layer 902, a piezoelectric material layer 904, a metal layer 906, a conductive bonding layer 908, and a load backing layer 910. Additional layers may also be implemented but are not shown for ease of illustration. The functions of the electrode layer 902, the piezoelectric material layer 904, the conductive bonding layer 908, and the load backing layer 910 are described above with reference to FIG. 7B and are, therefore, not repeated here. Additional layer included in this embodiment is the metal layer 906, and is described in detail herein.

The metal layer 906 may be referred to as a layer made of metals used to improve the conductivity between the piezoelectric material layer 904 and the conductive bonding layer 908. Examples of the metal layer 906 include silver (Ag) metal layer, copper (Cu) metal layer, aluminum (Al) metal layer, gold (Au) metal layer, and/or any other types of metal layers.

In one example, the metal layer 906 has a thickness in a range of 1.0 to 20 μm. In another example, the metal layer 906 has a thickness in a range of 3.0 to 10 μm. In still another example, the piezoelectric material layer 904 has a thickness in a range of 30 to 500 μm. In yet another example, the piezoelectric material layer 904 has a thickness in a range of 50 to 200 μm. In yet another example, the conductive bonding layer 908 has a thickness in a range of 1.0 to 100 μm. In yet another example, the conductive bonding layer 908 has a thickness in a range of 5.0 to 50 μm. In some embodiments, the conductive bonding layer 908 comprises metal powders and resin. Examples of the metal powders in the conductive bonding layer 908 include Ag metal powder, Cu metal powder, Al metal powder, Au metal powder, and/or any other types of metal powders.

In some embodiments, the conductive bonding layer 908 is vertically above and in direct contact with the load backing layer 910, the metal layer 906 is vertically above and in direct contact with the conductive bonding layer 908, the piezoelectric material layer 904 is vertically above and in direct contact with the metal layer 906, and the electrode layer 902 is vertically above and in direct contact with the conductive bonding layer 908 while the piezoelectric material layer 904 and the metal layer 906 are horizontally surrounded by and not in direct contact with the electrode layer 902.

Figure 9B:
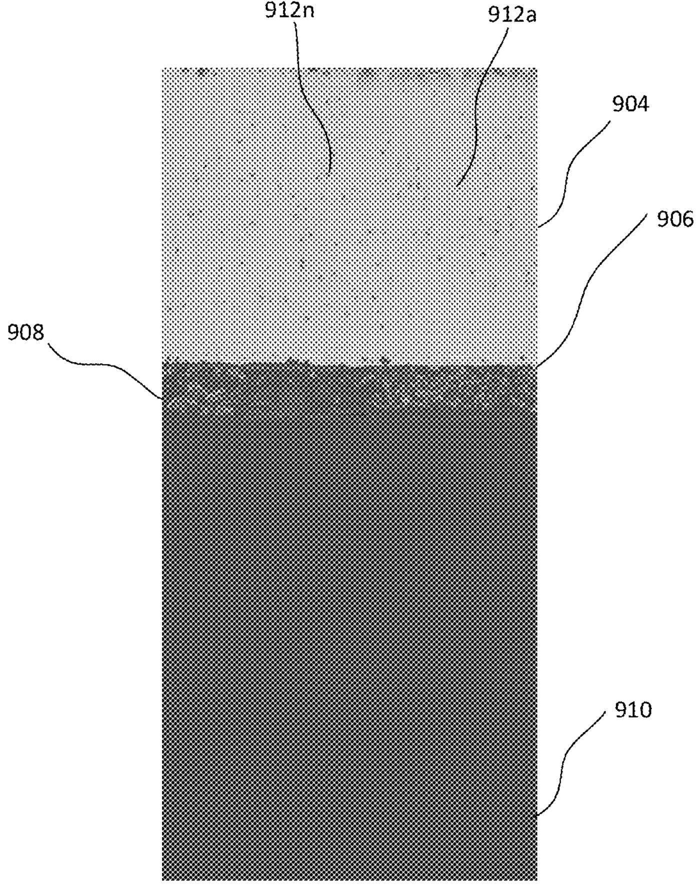
FIG. 9B illustrates another cross-sectional view of a piezoelectric component, according to an embodiment of the present disclosure.

FIG. 9B illustrates a microscopic cross-sectional view of the piezoelectric material layer 904, the metal layer 906, the conductive bonding layer 908, and the load backing layer 910 in the piezoelectric component 900, according to an embodiment of the present disclosure. In some embodiments, as shown in FIG. 9B, the piezoelectric material layer 904 comprise voids 912*a-n* as shown. The voids 912*a-n* may be produced as a result of a sintering process, especially during a cooling process that follows the sintering process. In some embodiments, the metal layer 906 and the piezoelectric material layer 904 are not sintered simultaneously. In some examples, the sintering process is a liquid phase sintering which results in residual stress after the sintering process. Voids 912*a-n* may occur so as to relieve the residual stress after the sintering process. Residual stress in a material may be referred to as a physical quantity that expresses the internal forces that neighboring particles of the material exert on each other. Reduction of residual stress in the piezoelectric material layer 904 by the voids 912*a-n* makes the piezoelectric material layer 904 less brittle. Therefore, the piezoelectric material layer 904 may be less susceptible to fatigue cracking and delamination with the presence of the voids 912*a-n*.

In some examples, the amount of voids in the piezoelectric material layer 904 is characterized by a porosity value. The porosity value in a material may be referred to as a percentage of void space in the material. In some embodiments, the porosity value is calculated as a ratio of the volume of voids in a material divided by the total volume of the material. In one example, the porosity value of the piezoelectric material layer 904 is in a range of 3% to 0.1% (material volume is 97% to 99.9% of total volume). In another example, the porosity value of the piezoelectric material layer 904 is in a range of 2% to 0.5% (material volume is 98% to 99.5% of total volume).

Figure 10A:
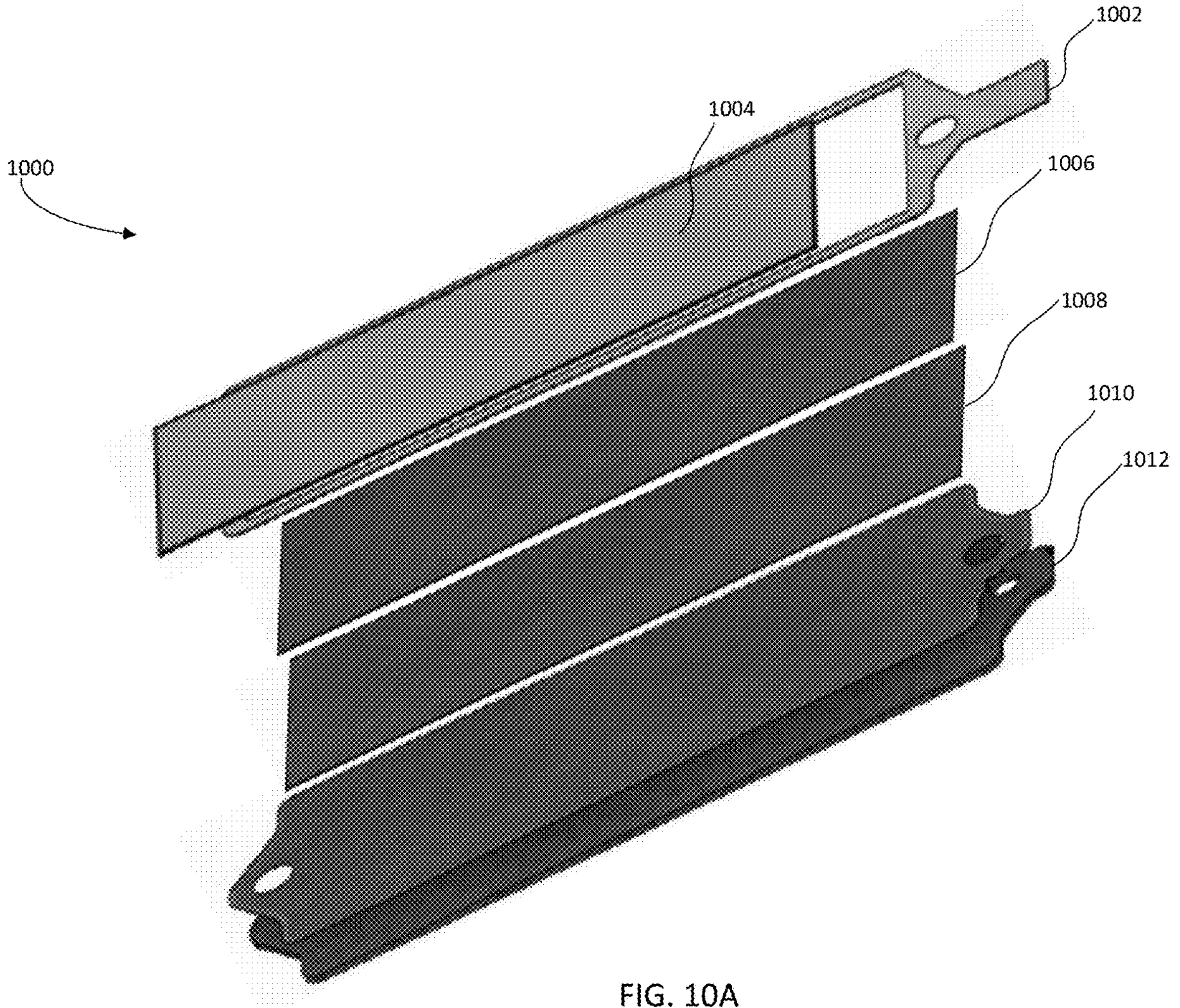
FIG. 10A illustrates still another example of a piezoelectric component, according to an embodiment of the present disclosure.

FIG. 10A illustrates still another example of a piezoelectric component 1000, according to an embodiment of the present disclosure. In this example, the piezoelectric component 1000 comprises an electrode layer 1002, a piezoelectric material layer 1004, an interface layer 1006, a metal layer 1008, a conductive bonding layer 1010, and a load backing layer 1012. The functions of the electrode layer 1002, the piezoelectric material layer 1004, the metal layer 1008, the conductive bonding layer 1010, and the load backing layer 1012 are described above with reference to FIG. 9A and are, therefore, not repeated here. An additional layer included in this embodiment is the interface layer 1006, and is described in detail herein.

The interface layer 1006 may be referred to as a layer formed between the piezoelectric material layer 1004 and the metal layer 1008 as a result of a sintering process which forms a bonding between the piezoelectric material layer 1004 and the metal layer 1008. In some embodiments, the interface layer 1006 is formed to further enhance the bonding between the piezoelectric material layer 1004 and the metal layer 1008.

In some embodiments, the material of the interface layer 1006 is determined based on the material of the piezoelectric material layer 1004. In one example, the piezoelectric material layer 1004 comprises bismuth (Bi)-based piezoelectric materials, and the resulting interface layer 1006 comprises Bi-based glass frit or Bi-based paste. In another example, the piezoelectric material layer 1004 comprises lead (Pb)-based piezoelectric materials, and the resulting interface layer

1006 comprises lead oxide. In some embodiments, the interface layer 1006 comprises amorphous lead oxide or amorphous bismuth oxide. In some other embodiments, the interface layer 1006 comprises materials of low melting points such as lead(IV) oxide ($PbO_2$) which has a melting point of 290° C.

Figure 10B:
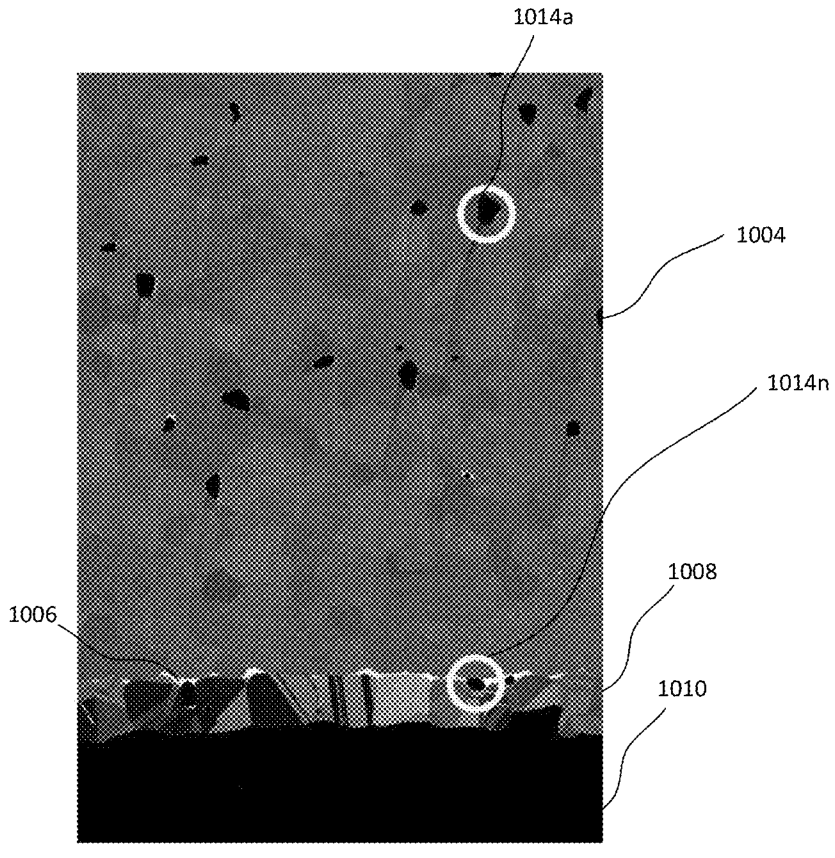
FIG. 10B illustrates yet another example of a cross-sectional view of a piezoelectric component, according to an embodiment of the present disclosure.

FIG. 10B illustrates an example of a cross-sectional scanning electron microscope (SEM) image of the piezoelectric material layer 1004, the interface layer 1006, the metal layer 1008, the conductive bonding layer 1010, and voids 1014*a-n* in the piezoelectric component 1000, according to an embodiment of the present disclosure. The functions of the piezoelectric material layer 1004, the interface layer 1006, the metal layer 1008, the conductive bonding layer 1010, and the voids 1014*a-n* are described above with reference to FIGS. 9B and 10A and are, therefore, not repeated here. In some embodiment, the voids 1014*a-n* are formed as a result of a sintering process, especially during a cooling process that follows the sintering process. In some example, the voids 1014*a-n* are formed in the interface layer 1006 to reduce internal stress of interface among the piezoelectric material layer 1004, the interface layer 1006, and the metal layer 1008. In some examples, the sintering process is a liquid phase sintering which results in residual stress after the sintering process. Voids 1014*a-n* may occur so as to relieve the residual stress after the sintering process.

Figure 11A:
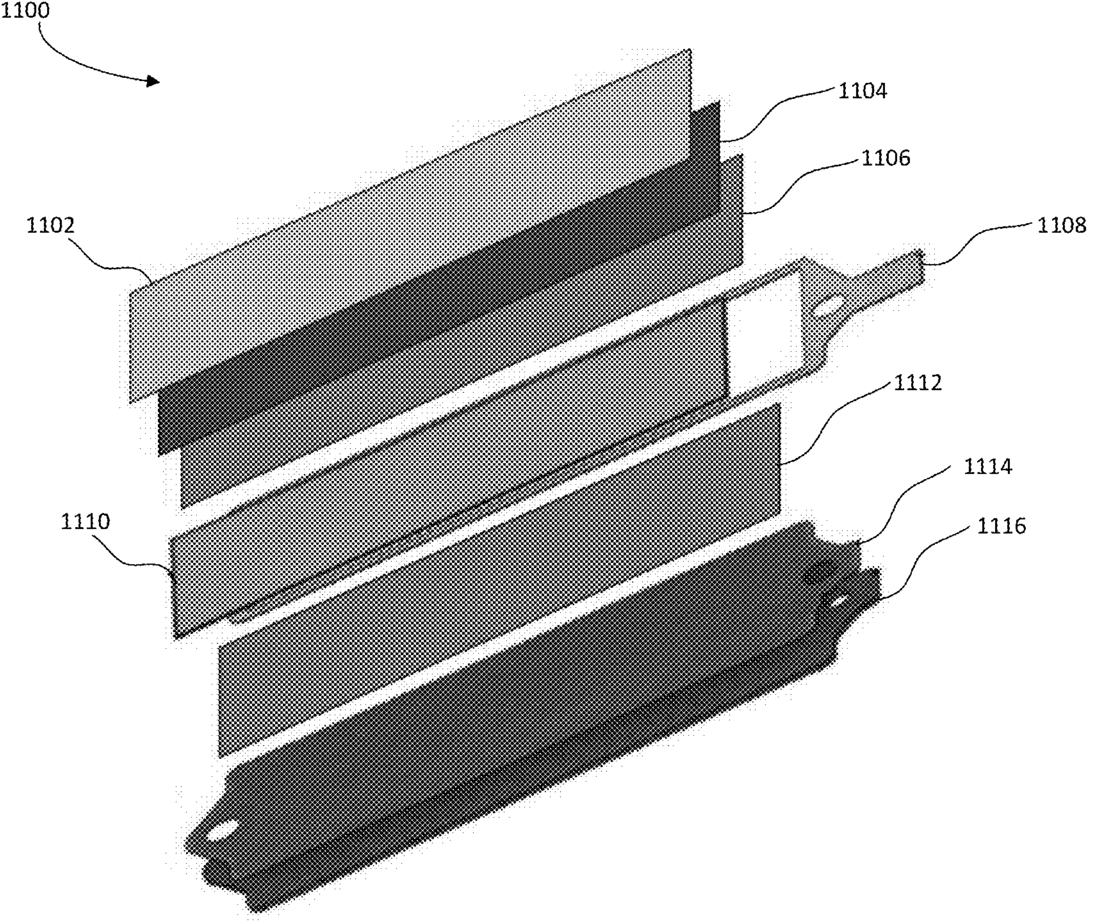
FIG. 11A illustrates still another example of a piezoelectric component, according to an embodiment of the present disclosure.

FIG. 11A illustrates still another example of a piezoelectric component 1100, according to an embodiment of the present disclosure. In this example, the piezoelectric component 1100 comprises two electrode layers 1102 and 1108, two conductive bonding layers 1104 and 1114, two metal layers 1106 and 1112, a piezoelectric material layer 1110, a load backing layer 1116. The functions of the electrode layers 1102 and 1108, the conductive bonding layers 1104 and 1114, the metal layer 1112, the piezoelectric material layer 1110, and the load backing layer 1116 are described above with reference to FIGS. 8A and 9A and are, therefore, not repeated here. An additional layer included in this embodiment is the metal layer 1106. The metal layer 1106 may be used to improve the conductivity between the piezoelectric material layer 1110 and the conductive bonding layer 1104.

Figure 11B:
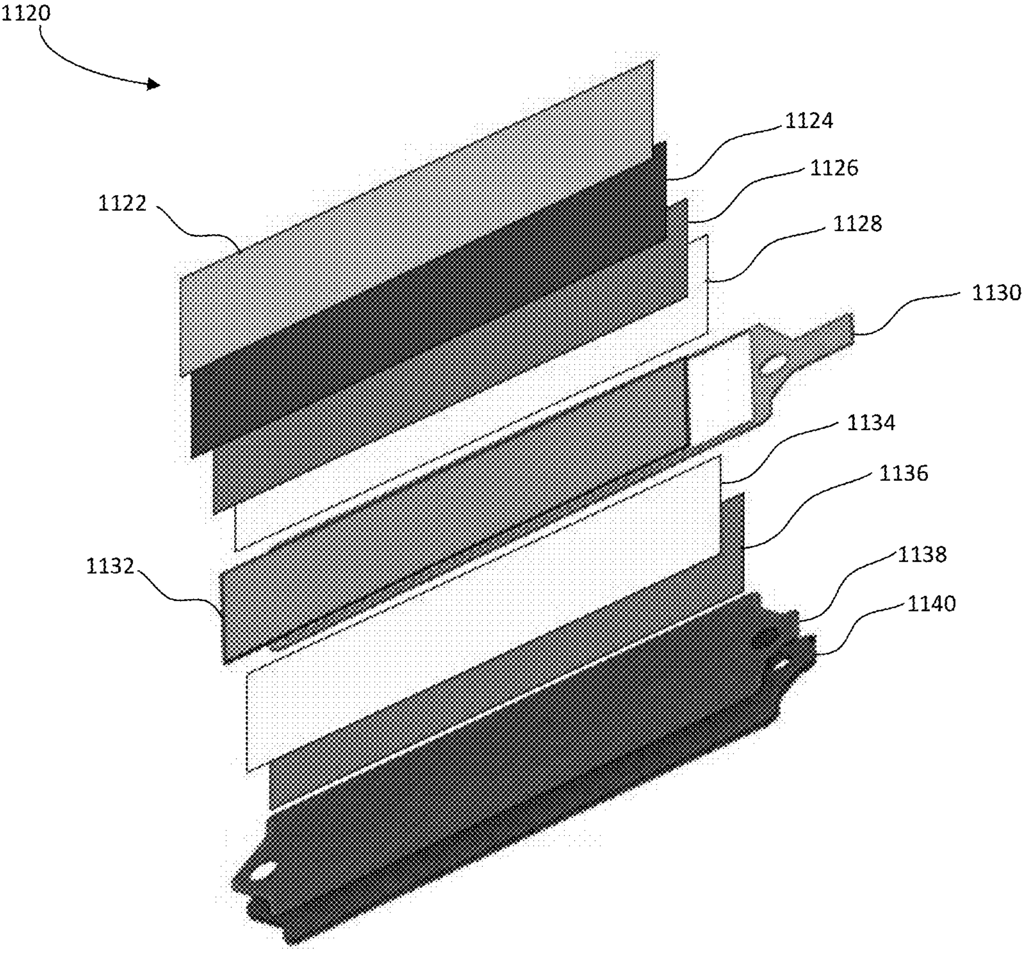
FIG. 11B illustrates still another example of a piezoelectric component, according to an embodiment of the present disclosure.

FIG. 11B illustrates still another example of a piezoelectric component 1120, according to an embodiment of the present disclosure. In this example, the piezoelectric component 1120 comprises two electrode layers 1122 and 1130, two conductive bonding layers 1124 and 1138, two metal layers 1126 and 1136, two interface layers 1128 and 1134, a piezoelectric material layer 1132, a load backing layer 1140. The functions of the electrode layers 1122 and 1130, the conductive bonding layers 1124 and 1138, the metal layers 1126 and 1136, the interface layer 1134, the piezoelectric material layer 1132, and the load backing layer 1140 are described above with reference to FIGS. 10A and 11A and are, therefore, not repeated here. An additional layer included in this embodiment is the interface layer 1128. The interface layer 1128 may be formed to enhance the bonding between the piezoelectric material layer 1132 and the metal layer 1126. The material of the interface layer 1128 may be determined based on the material of the piezoelectric material layer 1132.

Figure 11C:
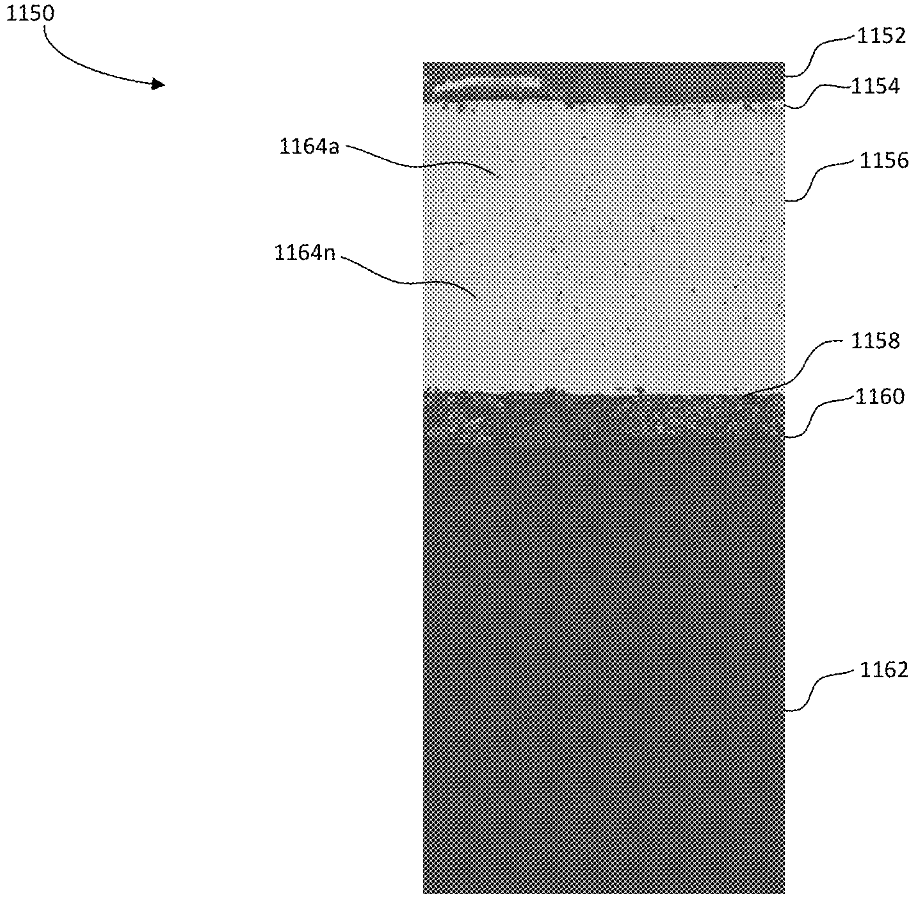
FIG. 11C illustrates still another example of a cross-sectional view of a piezoelectric component, according to an embodiment of the present disclosure.

FIG. 11C illustrates another example of a microscopic cross-sectional view of a piezoelectric component 1150, according to an embodiment of the present disclosure. In some embodiments, the piezoelectric component 1150 comprises a conductive bonding layer 1152, a metal layer 1154, a piezoelectric material layer 1156, the metal layer 1158, the conductive bonding layer 1160, a load backing layer 1162, and voids 1164*a-n*. The functions of the conductive bonding layer 1152, the metal layer 1154, the piezoelectric material layer 1156, the metal layer 1158, the conductive bonding layer 1160, the load backing layer 1162, and the voids 1164*a-n* are described above with reference to FIGS. 9B and 10B and are, therefore, not repeated here.

In some embodiments, the load backing layer 1140 may comprise a fiber reinforced composite material. Examples of the fiber reinforced composite material include a carbon fiber composite (CFC) material, a glass fiber composite material, a carbon nanotube reinforced composite material, a graphene reinforced composite material, and a ceramic matrix composite material. In some examples, the fiber reinforced composite material comprises a CFC material. In one example, the CFC material comprises a checkered interwoven structure. In another example, the CFC material comprises a quasi-isotropic structure. The quasi-isotropic structure may be referred to as a structure made of carbon fiber weaves with plies oriented at various degrees.

Figure 12:
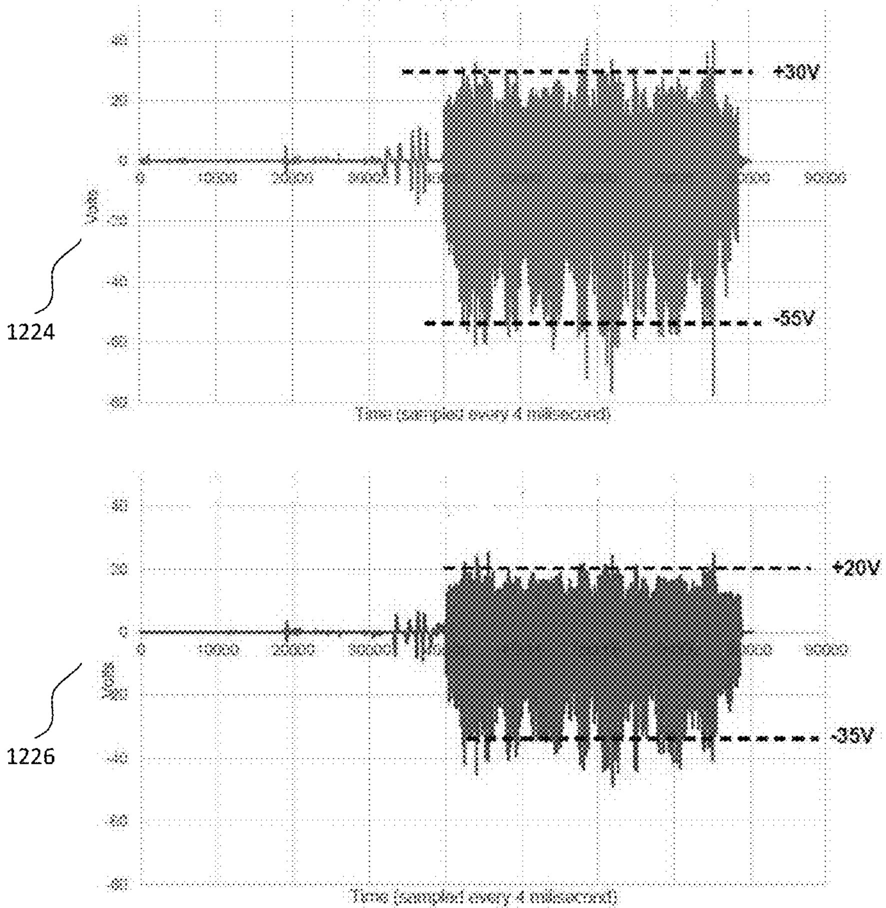
FIG. 12 illustrates improved power generation using a carbon fiber composite material as compared to a steel material, in accordance with various embodiments.

In some embodiments, the CFC structure results in a stiffer material (higher Young's Modulus) that results in higher stress production for a same amount of strain, thus imparting higher stress to the piezoelectric material layer 1132, in presence of the interface layer 1134. Therefore, the energy harvester 306 may produce higher charge output and higher power with the checkered interwoven CFC structure or the quasi-isotropic CFC structure. For example, referring to FIG. 12, an improved power generation using a carbon fiber composite material as compared to a steel material is illustrated. As can be seen, a CFC voltage production timing diagram 1224 and a steel voltage production timing diagram 1226 are illustrated with x-axis showing the time in milliseconds, and y-axis showing the produced voltage value in the energy harvester 306. In some examples, the load backing layer 1140 with a steel material produces a peak-to-peak voltage value of 55 volts, while the load backing layer 1140 with a CFC material produces a peak-to-peak voltage value of 85 volts, which is about 50% higher than the peak-to-peak voltage value produced by the steel material.

In some embodiments, the particular microstructure in the checkered interwoven CFC structure and the quasi-isotropic CFC structure also offers a higher elastic modulus, a higher tensile strength, a higher chemical resistance, a higher temperature tolerance, a lower thermal expansion, and a lower weight than the values produced by the steel embodiment of the load backing layer 1140. Examples of elastic modulus include Young's modulus, bulk modulus, and transverse elasticity modulus. In some embodiments, the quasi-isotropic CFC structure offers a higher stiffness than the checkered interwoven CFC structure, thus creating more strain for a same amount of bending of the structure. In some embodiments, lamination thermoset epoxies may also be appropriately chosen to further enhance the stiffness of the checkered interwoven CFC structure and the quasi-isotropic CFC structure, thus making the checkered interwoven CFC structure and the quasi-isotropic CFC structure more robust to high temperature.

In one example, the CFC material in the load backing layer 1140 comprises a density in a range of from about 1500 $kg/m^3$ to about 2000 $kg/m^3$, a tensile strength in a range of from about 3000 MPa to about 4000 MPa, a Young's modulus in a range of from about 300 GPa to about 500 GPa. The higher Young's modulus in the CFC material in the load backing layer 1140 may produce a higher mechanical strain imparted on the piezoelectric component to prevent cracking or degradation due to tensile and/or compressive forces acting on the piezoelectric component. Therefore, more deformations in the piezoelectric component may be produced throughout the lifetime of the integrated energy harvester.

Figure 13:
FIG. 13 is a flow chart of an energy harvester process, in accordance with various embodiments.
Figure 13:
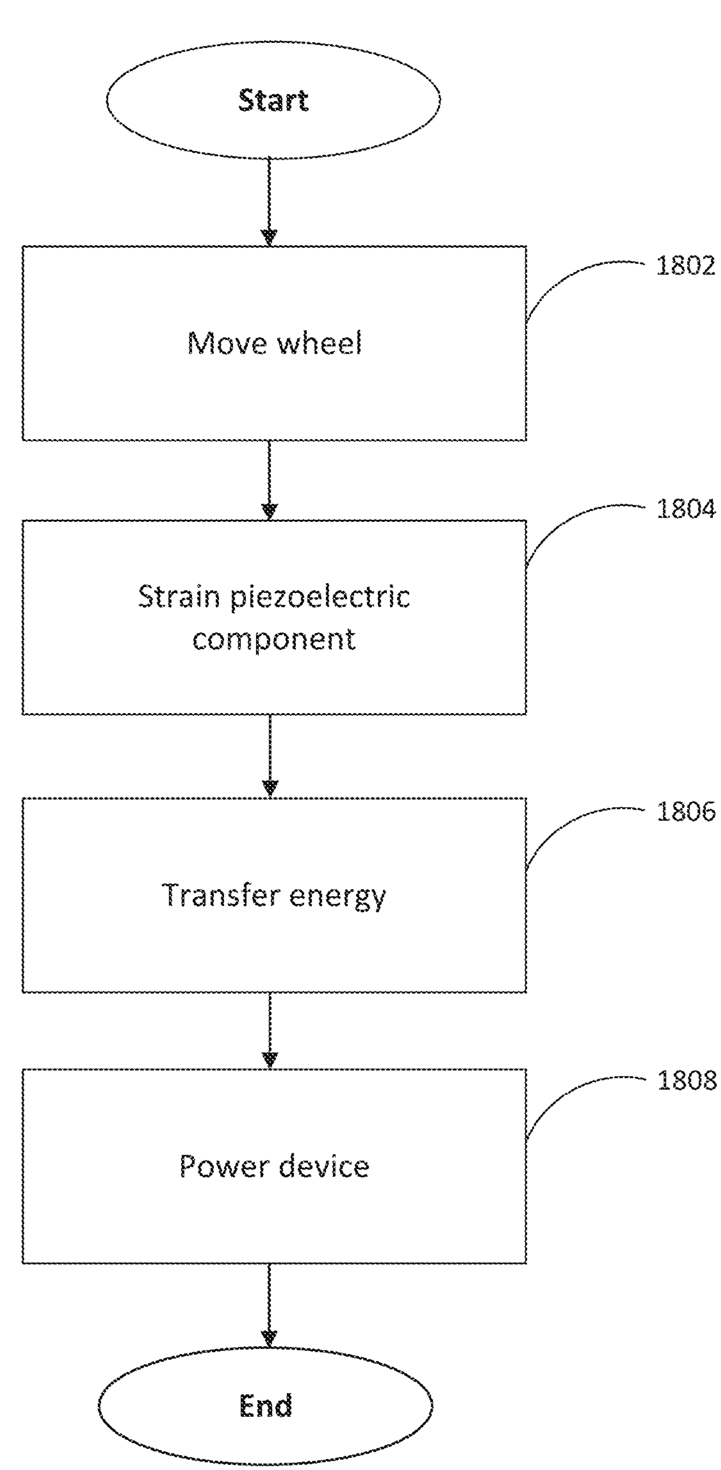

FIG. 13 is a flow chart of an energy harvester process 1800, in accordance with various embodiments. The process 1800 may be performed at a smart wheel sensor system that integrates an energy harvester and at least one device configured to be powered by the energy harvester, as introduced above. It is noted that the process 1800 is merely an example, and is not intended to limit the present disclosure. Accordingly, it is understood that additional operations (e.g., blocks) may be provided before, during, and after the process 1800 of FIG. 13, certain operations may be omitted, certain operations may be performed concurrently with other operations, and that some other operations may only be briefly described herein.

At block 1802, a wheel may be moved (e.g., rotated) under a load (e.g., a load of the wheel itself or a wheel driven object (e.g., a vehicle)). As noted above, this wheel may be a smart wheel or a smart wheel sensor system that integrates an energy harvester and at least one device configured to be powered by the energy harvester. The energy harvester includes a piezoelectric component placed on a curved staging surface. This curved staging surface may be part of a cavity into which the piezoelectric component may bend when strain is incurred (e.g., when biased). This curved staging surface may be either directly formed as part of the wheel or on a substrate mounted on part of the wheel in order to facilitate the application of strain onto the piezoelectric component.

Furthermore, this energy harvester may include a piezoelectric component that includes a piezoelectric material layer and at least one electrode layer. Also, the piezoelectric component may be connected with an interconnect and an electrical conduction component. This piezoelectric material layer may produce energy when mechanically deformed. The electrode layer may capture the energy produced by the piezoelectric material layer. The electrode layer may be connected via the interconnect to the electrical conduction component. The interconnect may be a flexible structure that connects the piezoelectric component to the electrical conduction component so that the electrical conduction component may channel and offload the energy produced by the piezoelectric component. This electrical conduction component may be connected with other devices of a device platform (e.g., an energy storage medium or a sensor of the smart wheel sensor system) to provide power to the other devices of the device platform.

At block 1804, the piezoelectric component of the energy harvester may deform (e.g., mechanically deform) to generate energy resulting from compressive force due to wheel rotation (e.g., a vehicle) acting on the bead area of the tire mounted on the rotatable component. Stated another way, the piezoelectric component may capture a kinetic energy of a transport moving in response to the rotatable component rotating. Accordingly, the piezoelectric component may generate energy when mechanical stress is applied to the piezoelectric component. For example, this energy may be in the form of an alternating current (AC) signal, which can be rectified into a direct current (DC) signal. Stated another way, the bending strain experienced at the piezoelectric component may generate energy (e.g., an AC voltage) with a frequency proportional to the rotational frequency of the wheel.

At block 1806, the energy generated by the energy harvester may be transferred to a device of the smart wheel sensor system. As noted above, this energy may be transferred by, for example, the electrical conduction component to the device. The electrical conduction component may be any type of conductor configured to transfer the energy produced by the energy harvester, such as a wire, a ribbon, or a pin made of a conductive material to transfer the energy from the energy harvester to the device.

At block 1808, the device connected with the electrical conduction component may be powered by the energy generated by the energy harvester. This device may be, for example, an energy storage medium or a sensor of the smart wheel sensor system. Accordingly, the energy harvester may be part of a smart wheel sensor system to provide power for least one energy storage medium or sensor of the smart wheel sensor system. The smart wheel sensor system may include multiple types of sensors, which may each be configured to collect different types of smart wheel sensor system data. For example, the smart wheel sensor system may include a height sensor configured to produce barometric pressure sensor data and/or measure deflection of an inner surface of a tire, as discussed above; an acoustic sensor configured to produce acoustic sensor data; an image sensor configured to produce image sensor data; a gas sensor configured to produce gas sensor data; a magnetic sensor configured to produce magnetic sensor data; an accelerometer sensor configured to produce acceleration sensor data; a gyroscope sensor configured to produce gyroscopic sensor data; and a humidity sensor configured to produce humidity sensor data.

Figure 14:
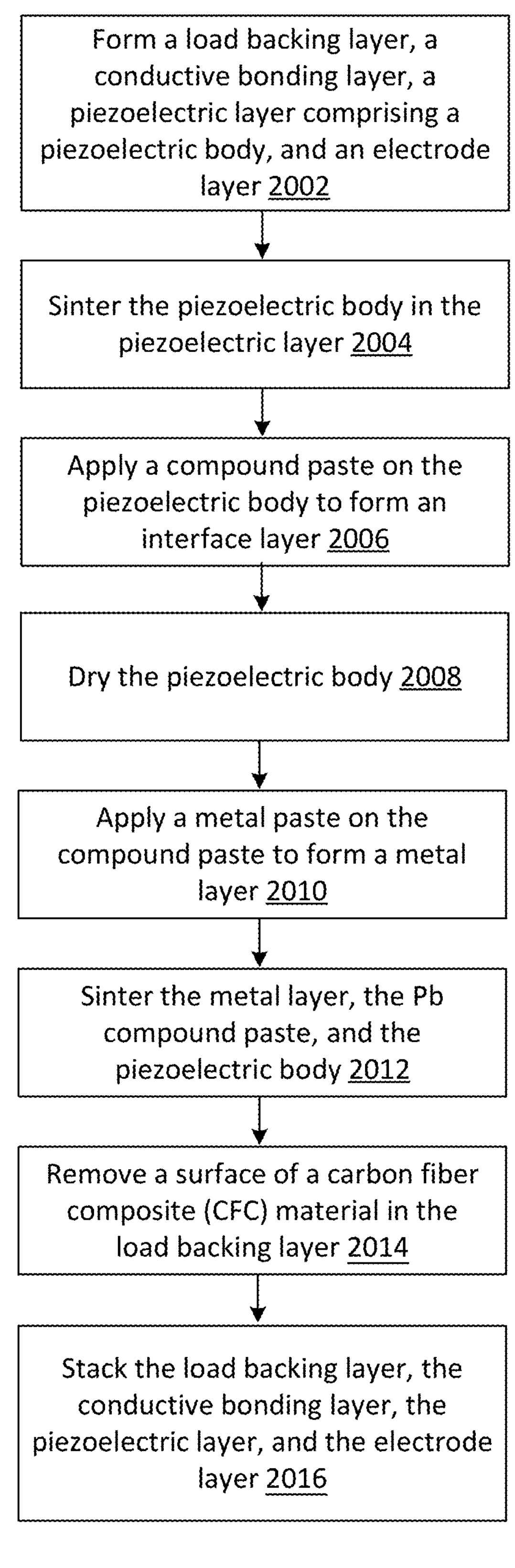
FIG. 14 illustrates an example method for fabricating a piezoelectric component, according to an embodiment of the present disclosure.

FIG. 14 illustrates an example method 2000 for fabricating a piezoelectric component, according to an embodiment of the present disclosure. The operations of method 2000 presented below are intended to be illustrative. In some embodiments, method 2000 may be accomplished with one or more additional operations not described and/or without one or more of the operations discussed. Additionally, the order in which the operations of method 2000 are illustrated in FIG. 14 and described below is not intended to be limiting.

At step 2002, a load backing layer, a conductive bonding layer, a piezoelectric layer comprising a piezoelectric body, and an electrode layer are formed. In one example, the load backing layer comprises a fiber reinforced composite material. In some embodiments, the fiber reinforced composite material comprises a CFC material, wherein the CFC material comprises a checkered interwoven structure or a quasi-isotropic structure, and the amount and orientation of fibers in the CFC material can be configured during manufacturing to offer a higher elastic modulus. In some embodiments, the conductive bonding layer comprises metal powders and resin used to transfer the effect produced by the high elastic modulus in the CFC material from the load backing layer to the piezoelectric material layer.

At step 2004, the piezoelectric body of the piezoelectric layer is sintered. In some embodiments, the piezoelectric body in sintered by first forming a lead zirconate titanate (PZT) mold using a dry pressing process containing Polyvinylpyrrolidinone (PVP) as a binder, then sintering the PZT mold at a temperature of 1100° C. to 1250° C. for 2 to 24 hours.

At step 2006, a compound paste is applied on the piezoelectric body to form an interface layer. In some embodiments, the compound paste is applied using a dip coating process or a screen-printing process. In some examples, the material of the compound paste used to form the interface layer 1106, as discussed above, is determined based on the material of the piezoelectric body. In one example, the piezoelectric body comprises Bi-based piezoelectric materials, therefore, the interface layer is configured to comprise Bi-based glass frit or Bi-based paste. In another example, the piezoelectric body comprises Pb-based piezoelectric materials, therefore, the compound paste is configured to comprise lead monoxide (PbO), lead acetate ($Pb(CH_3COO)_2$), or Pb-based glass frit, wherein a mass fraction of the Pb-based glass frit in the Pb compound paste is in a range of about 3% to about 10% to make voids in the interface layer. In some embodiments, the voids in the interface layer reduce the stress level in the interface layer, which makes the piezoelectric component less brittle and less susceptible to fatigue cracking and delamination.

At step 2008, the piezoelectric body is dried. In some embodiments, the piezoelectric body is dried at a temperature of about 50° C. to about 80° C. for a duration of 1 to 30 hours.

At step 2010, a metal paste is applied on the compound paste to form a metal layer. In some embodiments, the metal paste comprises a silver (Ag) paste and is applied on the surface of the compound paste applied on the piezoelectric body. In some examples, the metal paste also comprises Pb-based glass frit.

At step 2012, the metal layer formed by the metal paste, the compound paste, and the piezoelectric body are sintered. In some embodiments, the metal layer, the compound paste, and the piezoelectric body are sintered at a temperature of about 300° C. to about 800° C. for a duration of 0.5 to 4 hours.

At step 2014, a surface layer of the fiber reinforced composite material in the load backing layer is removed. In some examples, the surface layer of the CFC material comprises a resin layer. In some embodiments, the surface layer is removed so that the CFC material is exposed on the surface of the load backing layer. The surface layer may be removed by a mechanical etching process or a laser etching process. Examples of the mechanical etching process used to remove the surface layer include chemical mechanical polishing, milling process, lathe process, and waterproof sandpaper polishing.

At step 2016, the load backing layer, the conductive bonding layer, the piezoelectric layer including the metal layer and the interface layer, and the electrode layer are stacked in a stacking process. In some embodiments, the stacking process is performed by stacking the load backing layer, the conductive bonding layer, the piezoelectric layer including the metal layer and the interface layer, and the electrode layer simultaneously at a pressure of about 0.1 to 2.0 MPa and a temperature of about 120 to 170° C. for a duration of about 5 to 100 seconds using a hydraulic heat press. In some examples, the stacked layers are passed to a vacuum oven and cured at a temperature of about 120 to 170° C. for a duration of about 15 to 120 seconds. In some embodiments, the conductive bonding layer is used to bond the load backing layer, the piezoelectric layer, and the electrode layer.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two, which can be designed using source coding or some other technique), various forms of program or design code incorporating instructions (which can be referred to herein, for convenience, as "software" or a "software module), or combinations of both. To clearly illustrate this interchangeability of hardware and software, various illustrative components, blocks, modules, circuits, and steps have been described above generally in terms of their functionality. Whether such functionality is implemented as hardware, firmware or software, or a combination of these technique, depends upon the particular application and design constraints imposed on the overall system. Skilled artisans can implement the described functionality in various ways for each particular application, but such implementation decisions should not be interpreted as causing a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. An energy harvesting module, comprising:

a piezoelectric component configured to produce energy in response to mechanical strain imparted on the piezoelectric component, wherein:

the piezoelectric component is configured to deform while experiencing the mechanical strain, the piezoelectric component comprises:

one or more electrode layers comprising a first electrode layer, a piezoelectric material layer surrounded by, but not in contact with, the first electrode layer on a first plane, and one or more conductive bonding layers comprising a first conductive bonding layer in contact with the piezoelectric material layer in a first direction that is perpendicular to the first plane, wherein the first conductive bonding layer is positioned between the piezoelectric material layer and a load backing layer, and wherein the first conductive bonding layer is in contact with both the piezoelectric material layer and the load backing layer, and the load backing layer comprises a fiber reinforced composite material.

2. The energy harvesting module of claim 1, wherein the fiber reinforced composite material comprises at least one of: a carbon fiber composite material, a glass fiber composite material, a carbon nanotube reinforced composite material, a graphene reinforced composite, and a ceramic matrix composite material.

3. The energy harvesting module of claim 2, wherein the fiber reinforced composite material comprises an exposed fiber surface in contact with the first conductive bonding layer.

4. The energy harvesting module of claim 3, wherein the fiber reinforced composite material has a corresponding elastic modulus, wherein the elastic modulus corresponding to the fiber reinforced composite material with the exposed fiber surface is higher than the elastic modulus corresponding to the fiber reinforced composite material without the exposed fiber surface.

5. The energy harvesting module of claim 1, wherein the one or more electrode layers further comprise a second electrode layer, the one or more conductive bonding layers further comprise a second conductive bonding layer, wherein:

the second conductive bonding layer is in contact with the piezoelectric material layer, and the second electrode layer is in contact with the second conductive bonding layer.

6. The energy harvesting module of claim 1, wherein the one or more conductive bonding layers comprise metal powders and resin.

7. An energy harvesting module, comprising:

a piezoelectric component configured to produce energy in response to mechanical strain imparted on the piezoelectric component, wherein:

the piezoelectric component is configured to deform while experiencing the mechanical strain, and the piezoelectric component comprises:

one or more electrode layers comprising a first electrode layer, a piezoelectric material layer surrounded by, but not in contact with, the first electrode layer on a first plane, one or more conductive bonding layers comprising a first conductive bonding layer in contact with the piezoelectric material layer in a first direction that is perpendicular to the first plane, wherein the first conductive bonding layer is positioned between the piezoelectric material layer and a load backing layer, and wherein the first conductive bonding layer is in contact with both the piezoelectric material layer and the load backing layer, and one or more metal layers, wherein the load backing layer comprises a fiber reinforced composite material.

8. The energy harvesting module of claim 7, wherein the one or more metal layers comprise a first metal layer, wherein:

the first metal layer is in contact with the first conductive bonding layer and is electrically connected with the first conductive bonding layer, and the piezoelectric material layer is vertically above the first metal layer while the piezoelectric material layer is horizontally surrounded by the first electrode layer.

9. The energy harvesting module of claim 8, wherein the piezoelectric component further comprises one or more interface layers, wherein the one or more interface layers comprise a first interface layer, wherein:

the first interface layer is in contact with the first metal layer, and the piezoelectric material layer is in contact with the first interface layer.

10. The energy harvesting module of claim 8, wherein the one or more metal layers further comprise a second metal layer, the one or more electrode layers further comprise a second electrode layer, and the one or more conductive bonding layers further comprise a second conductive bonding layer, and wherein the second metal layer is vertically above the piezoelectric material layer.

11. The energy harvesting module of claim 10, wherein the second conductive bonding layer is vertically above and in contact with the second metal layer, and wherein the second conductive bonding layer is electrically connected with the second metal layer.

12. The energy harvesting module of claim 7, wherein the one or more metal layers comprise one or more silver (Ag) metal layers, copper (Cu) metal layers, aluminum (AI) metal layers, or gold (Au) metal layers.

13. The energy harvesting module of claim 9, wherein the one or more interface layers comprise amorphous lead oxide or amorphous bismuth oxide.

14. The energy harvesting module of claim 13, wherein the one or more interface layers comprise voids.

* * * * *